United States Patent
Han et al.

(10) Patent No.: US 10,991,742 B2
(45) Date of Patent: Apr. 27, 2021

(54) IMAGE SENSORS

(71) Applicant: Samsung Electronics Co., Ltd., Suwon-si (KR)

(72) Inventors: Dae-han Han, Hwaseong-si (KR); Sun-Hyun Kim, Anyang-si (KR); Han-seok Kim, Seoul (KR); Chung-ho Song, Uiwang-si (KR); Gyeong-hee Lee, Daegu (KR); Hee-geun Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 38 days.

(21) Appl. No.: 16/558,820

(22) Filed: Sep. 3, 2019

(65) Prior Publication Data

US 2020/0075643 A1    Mar. 5, 2020

(30) Foreign Application Priority Data

Sep. 4, 2018  (KR) .......................... 10-2018-0105316

(51) Int. Cl.
*H01L 27/146* (2006.01)
*H01L 21/00* (2006.01)
*H01L 23/522* (2006.01)

(52) U.S. Cl.
CPC ...... *H01L 27/1463* (2013.01); *H01L 23/5226* (2013.01); *H01L 27/14605* (2013.01); *H01L 27/14607* (2013.01); *H01L 27/14623* (2013.01); *H01L 27/14636* (2013.01); *H01L 27/14685* (2013.01)

(58) Field of Classification Search
CPC .......... H01L 27/14607; H01L 23/5226; H01L 27/1463; H01L 27/1605; H01L 27/14623; H01L 27/14636; H01L 27/1685
See application file for complete search history.

(56) References Cited

U.S. PATENT DOCUMENTS

| 6,930,382 B2 | 8/2005 | Sawada et al. |
| 8,736,012 B2 | 5/2014 | Huang et al. |
| 8,841,200 B2 | 9/2014 | Cheng et al. |

(Continued)

FOREIGN PATENT DOCUMENTS

| KR | 20-0470298 Y1 | 12/2013 |
| KR | 20-0474421 Y1 | 9/2014 |

*Primary Examiner* — Alonzo Chambliss
(74) *Attorney, Agent, or Firm* — Harness, Dickey & Pierce, P.L.C.

(57) ABSTRACT

An image sensor includes a semiconductor substrate having a first surface and a second surface, a pixel element isolation film extending through an interior of the semiconductor substrate and defining a plurality of active pixels in the semiconductor substrate, and a dummy element isolation film extending through the interior of the semiconductor substrate and extending along at least one side of the active pixels in a plan view and defining a plurality of dummy pixels in the semiconductor substrate. The pixel element isolation film may have a first end that is substantially coplanar with the first surface and has a first width in a first direction parallel to the first surface, and the dummy element isolation film has a first end that is substantially coplanar with the first surface and has a second width that is greater than the first width of the pixel element isolation film.

20 Claims, 19 Drawing Sheets

(56) References Cited

U.S. PATENT DOCUMENTS

| | | | |
|---|---|---|---|
| 8,916,471 B1 | 12/2014 | Yang et al. | |
| 9,160,949 B2 * | 10/2015 | Zhang | H01L 31/02027 |
| 9,679,935 B2 | 6/2017 | Urn et al. | |
| 9,818,781 B2 | 11/2017 | Lee et al. | |
| 9,923,010 B2 | 3/2018 | Yanagita et al. | |
| 10,332,925 B2 * | 6/2019 | Oh | H01L 27/14605 |
| 10,361,239 B2 * | 7/2019 | Lee | H01L 27/14636 |
| 10,825,990 B2 * | 11/2020 | Eom | H01L 51/4253 |
| 2015/0255495 A1 * | 9/2015 | Park | H01L 27/14636 |
| | | | 257/432 |
| 2020/0135791 A1 * | 4/2020 | Yoon | H01L 31/102 |

\* cited by examiner

IMAGE SENSORS

CROSS-REFERENCE TO RELATED APPLICATION

This application claims the benefit, under 35 U.S.C. § 119, of Korean Patent Application No. 10-2018-0105316, filed on Sep. 4, 2018, in the Korean Intellectual Property Office, the disclosure of which is incorporated herein in its entirety by reference.

BACKGROUND

The inventive concepts relate to image sensors, and more particularly, to image sensors that include a photodiode.

An image sensor is a device configured to convert an optical image signal into an electric signal. An image sensor may include a pixel region configured to receive incident light and convert the received light into an electric signal, and the image sensor may further include a plurality of photodiode regions and a pad region configured to provide an electrical connection to the pixel region. As the degree of integration of the image sensor increases, the size of each photodiode region of the plurality of photodiode regions decreases and process difficulty increases.

SUMMARY

The inventive concepts provide image sensors configured to enable mitigation and/or prevention of a defect in a patterning process to manufacture the image sensors based on preventing a difference between upper surface levels of a pixel region and a pad region in a process of planarizing a substrate to manufacture an image sensor.

According to some example embodiments, an image sensor may include a semiconductor substrate having a first surface and a second surface, a pixel element isolation film extending through an interior of the semiconductor substrate between the first and second surfaces of the semiconductor substrate and defining a plurality of active pixels in the semiconductor substrate, and a dummy element isolation film extending through the interior of the semiconductor substrate between the first and second surfaces of the semiconductor substrate and extending along at least one side of the active pixels in a plan view and defining a plurality of dummy pixels in the semiconductor substrate. The pixel element isolation film may have a first end that is substantially coplanar with the first surface, the first end of the pixel element isolation film having a first width in a first direction parallel to the first surface. The dummy element isolation film may have a first end that is substantially coplanar with the first surface, the first end of the dummy element isolation film having a second width that is greater than the first width of the pixel element isolation film.

According to some example embodiments, an image sensor may include a semiconductor substrate including an active pixel region and a pad region, the semiconductor substrate having a first surface and a second surface opposite to the first surface, a pixel element isolation film in the active pixel region of the semiconductor substrate, the pixel element isolation film in a pixel trench extending through the interior of the semiconductor substrate from the first surface to the second surface, and a dummy element isolation film in a dummy trench extending through the interior of the semiconductor substrate from the first surface to the second surface of the semiconductor substrate, the dummy element isolation film extending between the active pixel region and the pad region in at least one of a first direction and a second direction parallel to the first surface. The pixel element isolation film may have a first end that is substantially coplanar with the first surface, the first end of the pixel element isolation film having a first width in the first direction. The dummy element isolation film may have a first end that is substantially coplanar with the first surface, the first end of the dummy element isolation film having a second width in the first direction that is greater than the first width in the first direction.

According to some example embodiments, an image sensor may include a semiconductor substrate including an active pixel region and a pad region, the semiconductor substrate having a first surface and a second surface opposite to the first surface, a pixel element isolation film in the active pixel region of the semiconductor substrate, the pixel element isolation film in a pixel trench extending through an interior of the semiconductor substrate from the first surface to the second surface, and a dummy element isolation film in a dummy trench extending through the interior of the semiconductor substrate from the first surface to the second surface, the dummy element isolation film in at least one side of the pixel element isolation film in a plan view. The pixel element isolation film may have a first height in a third direction perpendicular to the first surface of the semiconductor substrate. The dummy element isolation film may have a second height in the third direction, the second height greater than the first height.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Hereinafter, example embodiments of the inventive concepts will be described in detail with reference to the accompanying drawings.

Figure 1:
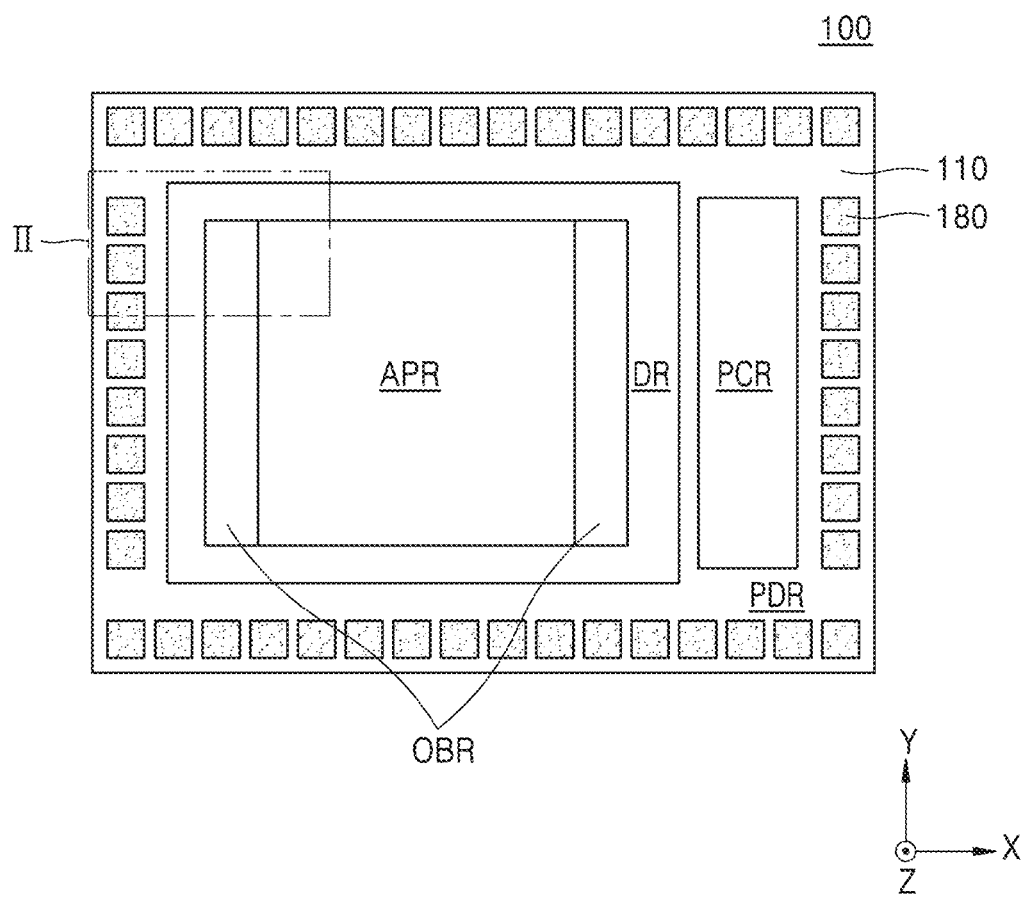
FIG. 1 is a layout diagram illustrating an image sensor according to some example embodiments.
Figure 2:
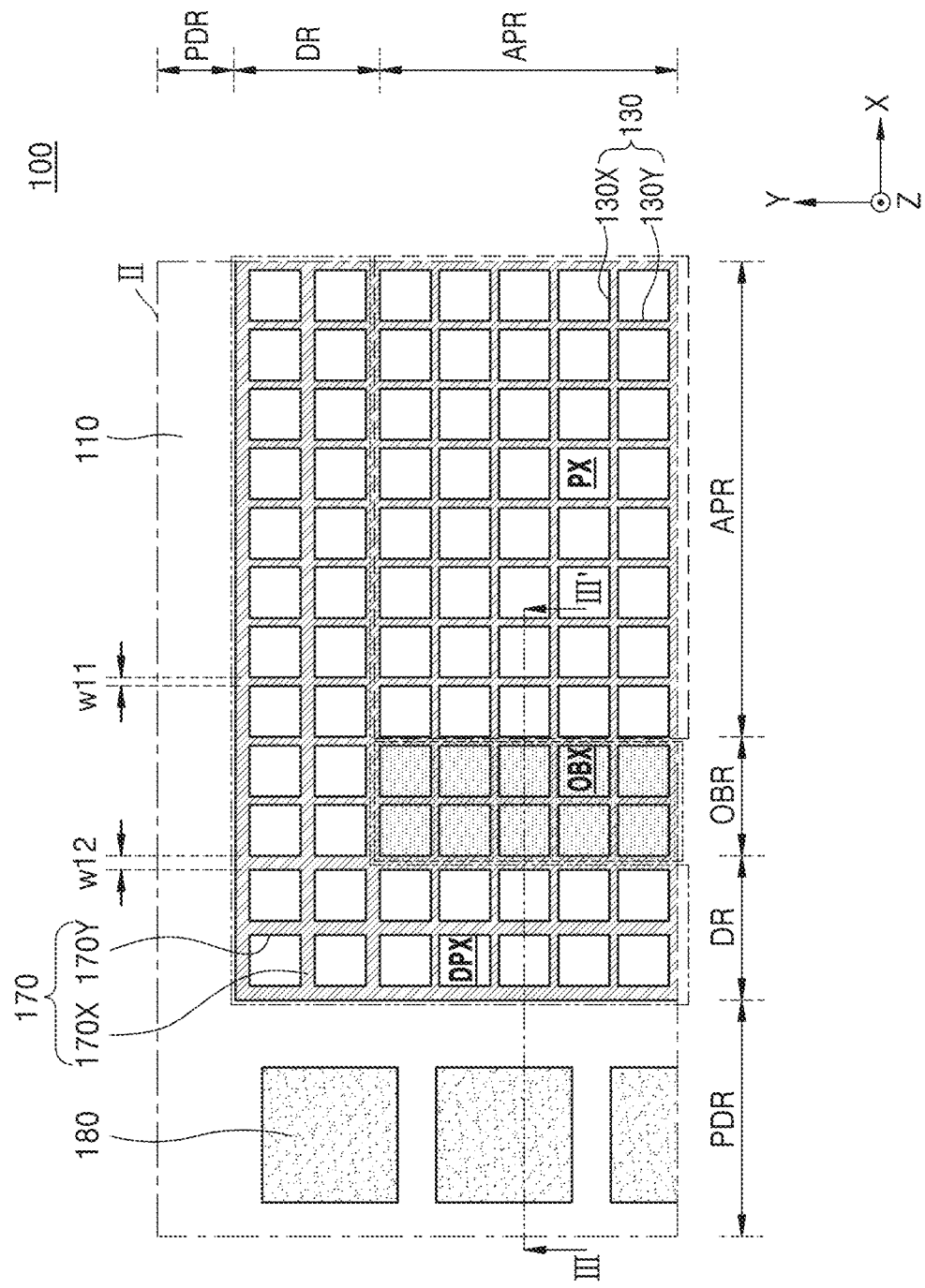
FIG. 2 is an enlarged view of a region II in FIG. 1.
Figure 3:
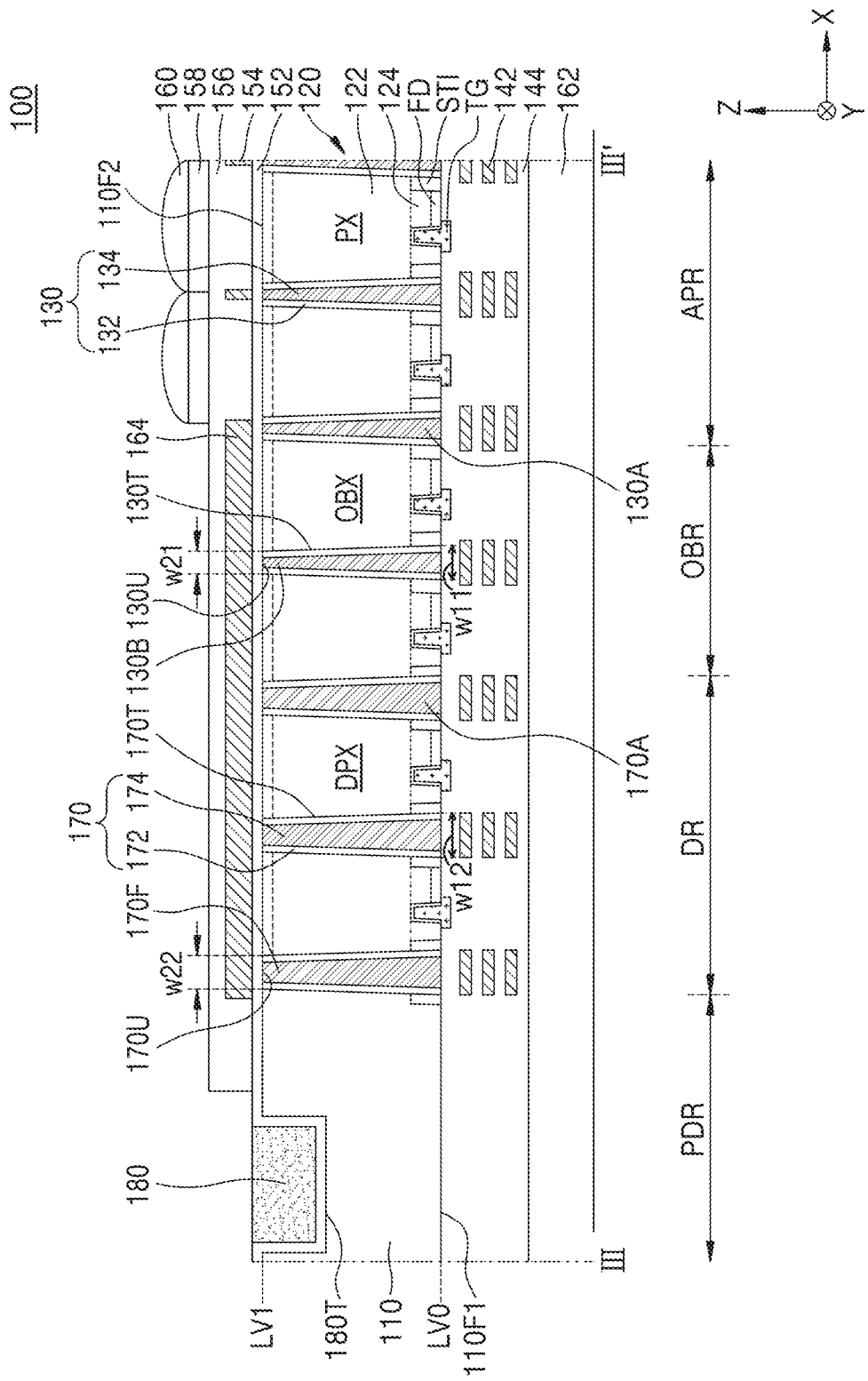
FIG. 3 is a cross-sectional view taken along line III-III' of FIG. 2.

FIG. 1 is a layout diagram illustrating an image sensor 100 according to some example embodiments. FIG. 2 is an enlarged view of a region II in FIG. 1. FIG. 3 is a cross-sectional view taken along line III-III' of FIG. 2. In FIGS. 1 and 2, a part of the configuration of the image sensor 100 is illustrated for the sake of convenience.

Referring to FIGS. 1 to 3, the image sensor 100 may include an active pixel region APR, a dummy pixel region DR, an optical black region OBR, a peripheral circuit region PCR, and a pad region PDR formed on a semiconductor substrate 110.

The active pixel region APR may be placed at a center region of the semiconductor substrate 110, and the optical black region OBR may be placed at both sides of the active pixel region APR. The dummy pixel region DR may be arranged to surround the active pixel region APR and the optical black region OBR. In some example embodiments, the semiconductor substrate 110 may include the optical black region OBR between the active pixel region APR and the dummy pixel region DR. A peripheral circuit region PCR may be placed on one side of the active pixel region APR with the dummy pixel region DR therebetween. As shown in FIG. 1, a pad region PDR may be arranged to surround, in a plan view the active pixel region APR, the optical black region OBR, the dummy pixel region DR, and the peripheral circuit region PCR at an edge region of the semiconductor substrate 110.

The active pixel region APR may include a plurality of active pixels PX, and a plurality of photoelectric conversion regions 120 may be placed in each of the plurality of active pixels PX. In the active pixel region APR, a plurality of active pixels PX may be arranged in a first direction (e.g., the X direction in FIG. 2) parallel to a top surface of the semiconductor substrate 110 and the bottom surface of the semiconductor substrate 110 (e.g., the first surface 110F1), may be arranged in rows and columns in a second direction (e.g., the Y direction in FIG. 2) that is parallel to the upper surface of the semiconductor substrate 110 and the bottom surface of the semiconductor substrate 110 (e.g., the first surface 110F1) and perpendicular to the first direction, and may be arranged in a matrix form.

Figure 6:
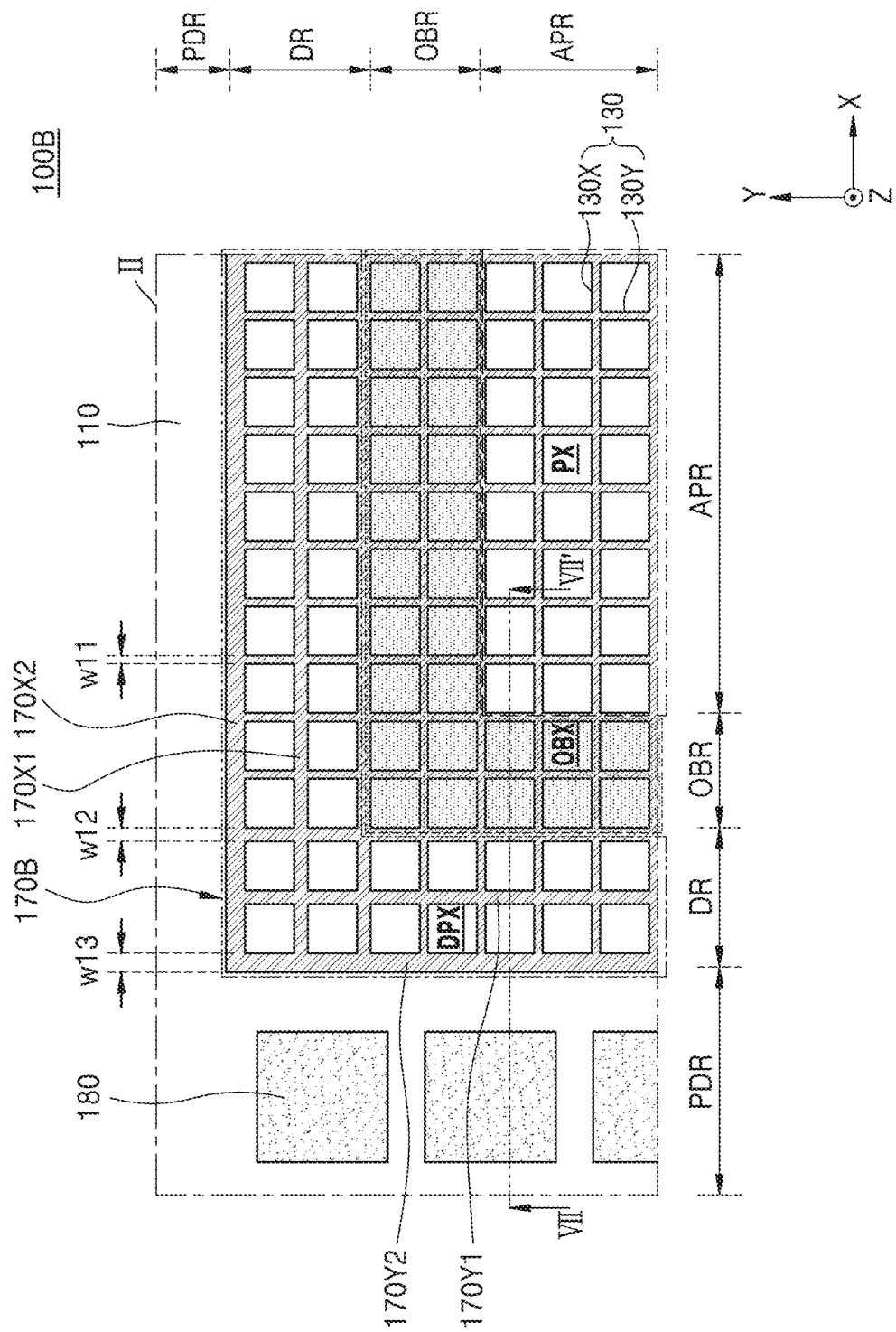
FIG. 6 is a layout diagram illustrating an image sensor according to some example embodiments.

The optical black region OBR may be placed on both sides of the active pixel region APR and may include a plurality of optical black pixels OBX. The optical black region OBR may extend on the semiconductor substrate 110 in a second direction (Y direction in FIG. 1). In contrast, as illustrated in FIG. 6, the optical black region OBR in a plan view may surround the active pixel region APR and may include a part extending in the first direction and a part extending in the second direction.

The dummy pixel region DR may be arranged such that the active pixel region APR and the optical black region OBR are surrounded by the dummy pixel region DR in a plan view. The dummy pixel region DR may include a region extending along the first direction and a region extending along the second direction. The dummy pixel region DR may include a plurality of dummy pixels DPX.

Although the peripheral circuit region PCR is illustratively shown as being placed on one side of the active pixel region APR in a plan view, the peripheral circuit region PCR is not limited thereto and may be placed such that the entire active pixel region APR, the optical black region OBR, and the dummy pixel region DR are surrounded by the peripheral circuit region PCR. A conductive pad 180 may be placed in the pad region PDR. The conductive pad 180 may be placed on an edge region of the semiconductor substrate 110.

The semiconductor substrate 110 may include a first surface 110F1 and a second surface 110F2 opposite to each other. Here, for convenience, a surface of the semiconductor substrate 110, on which a color filter 158 is placed, may be referred to as the second surface 110F2, and a surface opposite to the second surface 110F2 may be referred to as the first surface 110F1. However, the scope and spirit of the inventive concepts may not be limited thereto.

In example embodiments, the semiconductor substrate 110 may include a P-type semiconductor substrate. For example, the semiconductor substrate 110 may include a P-type silicon substrate. In example embodiments, the semiconductor substrate 110 may include a P-type bulk substrate and a P-type or N-type epitaxial layer grown thereon. In other embodiments, the semiconductor substrate 110 may include an N-type bulk substrate and a P-type or N-type epitaxial layer grown thereon. Alternatively, the semiconductor substrate 110 may include an organic plastic substrate.

A plurality of active pixels PX may be arranged in a matrix form in the semiconductor substrate 110 in the active pixel region APR. A plurality of photoelectric conversion regions 120 may be placed in each of the plurality of active pixels PX. Each of the plurality of photoelectric conversion regions 120 may include a photodiode region 122 and a well region 124.

As shown in at least FIG. 3, the pixel element isolation film 130 may be placed in ("may extend through an interior of") the semiconductor substrate 110, between the first surface 110F1 and the second surface 110F2, in the active pixel region APR and a plurality of active pixels PX may thus be defined by the pixel element isolation film 130. The pixel element isolation film 130 may be placed between one of the plurality of photoelectric conversion regions 120 and the photoelectric conversion region 120 adjacent thereto. A photoelectric conversion region 120 and another photoelectric conversion region 120 adjacent thereto may be physically and electrically separated by the pixel element isolation film 130. The pixel element isolation film 130 may be placed between the plurality of photoelectric conversion regions 120 arranged in a matrix form and may have a grid or mesh shape in a plan view.

As shown in at least FIG. 3, the pixel element isolation film 130 may be formed in a pixel trench 130T that extends through the interior of the semiconductor substrate 110 from the first surface 110F1 to the second surface 110F2 of the semiconductor substrate 110. As shown in at least FIG. 3, the pixel element isolation film 130 may include an insulating liner 132 conformally formed on an inner sidewall of the pixel trench 130T and a buried conductive layer 134 filling an inside region of the pixel trench 130T on the insulating liner 132. In example embodiments, the insulating liner 132 may include metal oxides such as hafnium oxide, aluminum oxide, and tantalum oxide. In this case, the insulating liner 132 may serve as a negative fixed charge layer, but the inventive concepts are not limited thereto. In other embodiments, the insulating liner 132 may include an insulating material such as silicon oxide, silicon nitride, and silicon oxynitride. The buried conductive layer 134 may include at least one of doped polysilicon, a metal, a metal silicide, a metal nitride, or a metal containing film.

In some example embodiments, as illustrated in FIG. 3, an element isolation film STI may be formed on the first surface 110F1 of the semiconductor substrate 110 to define an active region (not illustrated) and a floating diffusion region FD.

Gate electrodes (not illustrated) constituting a plurality of transistors may be formed on the first surface 110F1 of the semiconductor substrate 110. For example, a plurality of transistors may include a transfer transistor (not illustrated) configured to transfer the charge generated in the photoelectric conversion region 120 to the floating diffusion region FD, a reset transistor (not illustrated) configured to periodically reset the charge stored in the floating diffusion region FD, a drive transistor (not illustrated) configured to buffer a signal corresponding to the charge charged in the floating diffusion region and serving as a source follower buffer amplifier, and a selection transistor (not illustrated) serving as switching and addressing for selecting the active pixel region APR. However, the plurality of transistors are not limited thereto.

In FIG. 3, a transfer gate TG constituting the transfer transistor is formed as a recess gate type extending from the first surface 110F1 of the semiconductor substrate 110 to the inside of the semiconductor substrate 110. However, the shape of the transfer gate TG is not limited thereto.

A first internal wiring structure 142 may be placed on the first surface 110F1 of the semiconductor substrate 110. The first internal wiring structure 142 may be electrically connected to the gate electrodes or the active region. The first internal wiring structure 142 may be formed as a stacked structure of a plurality of layers. The first internal wiring structure 142 may include at least one of impurity-doped or undoped polysilicon, a metal, a metal silicide, a metal nitride, or a metal-containing film. For example, the first internal wiring structure 142 may include tungsten, aluminum, copper, tungsten silicide, titanium silicide, tungsten nitride, titanium nitride, doped polysilicon, and the like.

A first interlayer insulating film 144 is on the first surface 110F1 of the semiconductor substrate 110 and may be arranged to cover the first internal wiring structure 142 on the first surface 110F1 of the semiconductor substrate 110, as shown in at least FIG. 3. The first interlayer insulating film 144 may include an insulating material such as silicon oxide, silicon nitride, and silicon oxynitride.

A rear insulating layer 152 may be placed on the second surface 110F2 of the semiconductor substrate 110. The rear insulating layer 152 may be placed on substantially the entire area of the second surface 110F2 of the semiconductor substrate 110 and may be in contact with the top surface of the pixel element isolation film 130 placed at the same level as the second surface 110F2 of the semiconductor substrate 110. In example embodiments, the rear insulating layer 152 may include a metal oxide such as hafnium oxide, aluminum oxide, and tantalum oxide. In other embodiments, the rear insulating layer 152 may include an insulating material such as silicon oxide, silicon nitride, silicon oxynitride, or a low-k dielectric material.

A guide pattern 154 may be formed on the rear insulating layer 152. In a plan view, the guide pattern 154 may have a grid shape or a mesh shape. The guide pattern 154 may have a tilt angle to a photoelectric conversion region 120 and may prevent incoming light from entering the photoelectric conversion region 120 which is adjacent thereto. The guide pattern 154 may include at least one metallic material, for example, tungsten, aluminum, titanium, ruthenium, cobalt, nickel, copper, gold, silver, or platinum.

A passivation layer 156 may cover the rear insulating layer 152 and the guide pattern 154 on the second surface 110F2 of the semiconductor substrate 110. A color filter 158 and a microlens 160 may be placed on the passivation layer 156. Selectively, a support substrate 162 may be placed on the first surface 110F1 of the semiconductor substrate 110. Bonding members (not illustrated) may be further placed between the support substrate 162 and the first interlayer insulating film 144.

In the optical black region OBR, the pixel element isolation film 130 may be arranged in the semiconductor substrate 110, and a plurality of optical black pixels OBX may be defined by the pixel element isolation film 130. The plurality of optical black pixels OBX may have a structure similar to a plurality of active pixels PX. For example, as formed in the photoelectric conversion region 120, the photodiode region 122, the well region 124, a floating diffusion region FD, the element isolation film STI, and the gate electrodes may be formed in a plurality of optical black pixels OBX. The pixel element isolation film 130 may extend from the active pixel region APR to the optical black region OBR.

A light blocking layer 164 may be placed on the second surface 110F2 of the semiconductor substrate 110 in the optical black region OBR. The light blocking layer 164 may be arranged to cover the entire area of the optical black region OBR on the rear insulating layer 152. For example, the light blocking layer 164 may include at least one metal material selected from the group consisting of tungsten, aluminum, titanium, ruthenium, cobalt, nickel, copper, gold, silver, and platinum.

The optical black region OBR may function as a reference pixel for the active pixel region APR and may perform a function of automatically correcting a dark signal. For example, the light blocking layer 164 may block light from entering an optical black pixel OBX. A reference charge amount that is generated in the optical black pixel OBX with light blocked may be measured and an optical signal input from an active pixel PX may be calculated from the difference between a sensing charge amount and the reference charge amount by comparing the reference charge amount with the sensed charge amount generated from the active pixel PX.

The dummy pixel region DR may surround the active pixel region APR and the optical black region OBR in a plan view. The dummy pixel region DR functions as an etch stopping film for preventing dishing from occurring in the planarization process of the semiconductor substrate 110, and thus may be a region for preventing a patterning failure from occurring in the step of forming the color filter 158 on the active pixel region APR and may be a region for preventing light from penetrating into the optical black region OBR.

As shown in at least FIG. 3, in the dummy pixel region DR, a dummy element isolation film 170 may be placed in ("may extend through an interior of") the semiconductor substrate 110, between the first surface 110F1 and the second surface 110F2 of the semiconductor substrate 110, and a plurality of dummy pixels DPX may be defined by the dummy element isolation film 170. The plurality of dummy pixels DPX may be regions formed in the dummy pixel region DR of the semiconductor substrate and may not function as the active pixels PX. The plurality of dummy pixels DPX may be pixels further formed on the outer periphery of the semiconductor substrate 110 for uniform patterning of the entire active pixel PX placed in the active pixel region APR. Accordingly, as shown in at least FIGS. 1-3, the dummy element isolation film 170 may extend along at least one side of the active pixels PX in a plan view.

The plurality of dummy pixels DPX may have a structure similar to a plurality of active pixels PX. For example, as is formed in the photoelectric conversion region 120, a photodiode region 122, a well region 124, a floating diffusion region FD, an element isolation film STI, and the gate electrodes may be formed in the plurality of dummy pixels DPX. However, the inventive concepts are not limited thereto, and at least one of a photodiode region 122, a well region 124, a floating diffusion region FD, an element isolation film STI, and a gate electrode may not be formed in the plurality of dummy pixels DPX.

A dummy trench 170T may extend through the interior of the semiconductor substrate 110 from the first surface 110F1 to the second surface 110F2 of the semiconductor substrate 110. The dummy trenches 170T may be arranged to surround the pixel trenches 130T in a plan view. For example, in FIG. 2, it is illustrated as an example that the dummy trench 170T includes three line-shaped trenches extending in the first direction (X direction) and three line-shaped trenches extending in the second direction (Y direction). The dummy trenches 170T may be connected to the pixel trenches 130T.

The dummy element isolation film 170 may be formed in the dummy trench 170T and may extend through the interior of the semiconductor substrate 110 from the first surface 110F1 to the second surface 110F2 of the semiconductor substrate 110. In some example embodiments, including the example embodiments shown in FIGS. 1-3, because the dummy trenches 170T may surround the pixel trenches 130T in a plan view, the pixel element isolation film 130 is in the pixel trenches 130T, and the dummy element isolation film 170 is in the dummy trenches 170T, the dummy element isolation film 170 may surround the pixel element isolation film 130 in a plan view. As shown in at least FIG. 3, the dummy element isolation film 170 may include a dummy insulating liner 172 formed conformally on the inner sidewalls of the dummy trench 170T and a dummy buried conductive layer 174 filling the inside region of the dummy trench 170T on the dummy insulating liner 172. In example embodiments, the dummy insulating liner 172 may include a metal oxide such as hafnium oxide, aluminum oxide, tantalum oxide, or the like. In this case, the dummy insulating liner 172 may serve as a negative fixed charge layer, but the inventive concepts are not limited thereto. In other embodiments, the dummy insulating liner 172 may include an insulating material such as silicon oxide, silicon nitride, and silicon oxynitride. The dummy buried conductive layer 174 may include at least one of doped polysilicon, a metal, a metal silicide, a metal nitride, or a metal-containing film. In some example embodiments, the dummy buried conductive layer 174 may have a same material composition as the buried conductive layer 134.

In some example embodiments, including the example embodiments shown in FIG. 2, the dummy element isolation film 170 may be in at least one side of the pixel element isolation film 130 in a plan view.

As illustrated in the plan view of FIG. 2, the dummy element isolation film 170 may include a plurality of first dummy lines 170X extending in the X direction and a plurality of second dummy lines 170Y extending in the Y direction. The plurality of second dummy lines 170Y may intersect with each of the plurality of first dummy lines 170X. In addition, the pixel element isolation film 130 may include a plurality of first pixel isolation lines 130X extending in the X direction and a plurality of second pixel isolation lines 130Y extending in the Y direction, and the plurality of second pixel isolation lines 130Y may intersect with the plurality of first pixel isolation lines 130X, respectively.

A portion of each of the plurality of first dummy lines 170X may intersect with the plurality of second pixel isolation lines 130Y and a portion of each of the plurality of second dummy lines 170Y may intersect with the plurality of first pixel isolation lines 130X. At the intersections ("intersection points") of the plurality of first dummy lines 170X and the plurality of second pixel isolation lines 130Y and the intersections of the plurality of second dummy lines 170Y and the plurality of first pixel isolation lines 130X, the insulating liner 132 may be connected to the dummy insulating liner 172 and the buried conductive layer 134 may be connected to the dummy buried conductive layer 174. The insulating liner 132 and the dummy insulating liner 172 may be a material layer formed in the same process and the buried conductive layer 134 and the dummy buried conductive layer 174 may be a material layer formed in the same process.

The pixel element isolation film 130 may have a first width w11 in the first direction (X direction) at a first end 130A that is at the same level LV0 or substantially the same level LV0 (e.g., the same level within manufacturing tolerances and/or material tolerances) as the first surface 110F1 of the semiconductor substrate 110. Restated, the pixel element isolation film 130 has a first end 130A that is coplanar or substantially coplanar (e.g., coplanar within manufacturing tolerances and/or material tolerances) with the first surface 110F1, where the first end 130A has a first width w11. The dummy element isolation film 170 has a second width w12 at a first end 170A that is greater than the first width w11 in the first direction (X direction) at the same level LV0 or substantially the same level LV0 (e.g., the same level within manufacturing tolerances and/or material tolerances) as the first surface 110F1 of the semiconductor substrate 110. Restated, the dummy element isolation film 170 has a first end 170A that is coplanar or substantially coplanar (e.g., coplanar within manufacturing tolerances and/or material tolerances) with the first surface 110F1, where the first end 170A has a second width w12 that is greater than the first width w11. For example, the second width w12 of the first direction (X direction) may be from about 110% to about 200% of the first width w11, but is not limited thereto.

As described herein a "level" (e.g., LV0) that a given element is "at" may refer to a particular distance of the given element from the first surface 110F1 (also referred to as a "bottom surface") of the semiconductor substrate 110. It will be understood that, in some example embodiments, level LV0 is at a null distance from the first surface 110F1. The pixel element isolation film 130 may have a width w21 less than the first width w11 in the first direction (X direction) at a second end 130B that is at the same level LV1 or substantially the same level LV1 (e.g., the same level within manufacturing tolerances and/or material tolerances) as the second surface 110F2 of the semiconductor substrate 110. Restated, the pixel element isolation film 130 has a second end 130B that is coplanar or substantially coplanar (e.g., coplanar within manufacturing tolerances and/or material tolerances) with the second surface 110F2, where the second end 130B has a width w21 that is less than the first width w11. In addition, the dummy element isolation film 170 may have a width w22 less than the second width w12 in the first direction (X direction) at a second end 170F that is at the same level LV1 or substantially the same level LV1 (e.g., the same level within manufacturing tolerances and/or material tolerances) as the second surface 110F2 of the semiconductor substrate 110. Restated, the dummy element isolation film 170 has a second end 170F that is coplanar or substantially coplanar (e.g., coplanar within manufacturing tolerances and/or material tolerances) with the second surface 110F2, where the second end 170F has a width w22 that is less than the second width w12 in the first direction that is parallel with the first surface 110F1 of the semiconductor substrate 110. This is because a region of the semiconductor substrate 110 is removed from the first surface 110F1 of the semiconductor substrate 110 to form the pixel trench 130T, and the pixel element isolation film 130 and the dummy element isolation film 170 filling the pixel trench 130T and the dummy trench 170T may be formed, respectively. However, the inventive concepts are not limited thereto.

The light blocking layer 164 may extend to the dummy pixel region DR on the rear insulating layer 152, and all the plurality of dummy pixels DPX may be covered by the light blocking layer 164. In contrast, the light blocking layer 164 may be placed on the dummy pixel DPX of a part of the plurality of dummy pixels DPX, and the guide pattern 154 may be placed on the dummy pixel DPX of another part of the dummy pixel DPX.

A pad recess 180T having a given depth from the second surface 110F2 of the semiconductor substrate 110 may be formed in the pad region PDR, and the conductive pad 180 may be formed in the pad recess 180T. A rear insulating layer 152 may be further formed on the inner wall of the pad recess 180T to prevent electrical contact between the semiconductor substrate 110 and the conductive pad 180. In other embodiments, an additional insulating layer (not illustrated) may be formed on the inner wall of the pad recess 180T instead of or in addition to the rear insulating layer 152.

As the dummy element isolation film 170 is formed to have a larger width than the pixel element isolation film 130, the active pixel region APR, the dummy pixel region DR, and the pad region PDR have a relatively flat top surface level. For example, the second surface 110F2 of the semiconductor substrate 110 in the dummy pixel region DR and the top surface 170U of the dummy element isolation film 170 may be at substantially the same level as the top surface level LV1 of the second surface 110F2 of the semiconductor substrate 110 in the active pixel region APR. In addition, the second surface 110F2 of the semiconductor substrate 110 in the pad region PDR in FIGS. 1 to 3, and 5 to 19 may be substantially at the same level as the top surface level LV1 of the second surface 110F2 of the semiconductor substrate 110 in the active pixel region APR.

According to the manufacturing method according to some example embodiments, after the pixel trench 130T having a first height h01 (see FIG. 11) is formed from the first surface 110F1 of the semiconductor substrate 110 and the pixel element isolation film 130 filling the inside of the pixel trench 130T is formed, the semiconductor substrate 110 may be planarized from the second surface 110F2 of the semiconductor substrate 110 by a chemical mechanical polishing (CMP) process or the like to expose the bottom surface of the pixel element isolation film 130 on the second surface 110F2 of the semiconductor substrate 110.

In the case of an image sensor according to a comparative example in which the dummy element isolation film 170 is not formed, in this process, the etching rate of the semiconductor substrate 110 due to the planarization chemicals may be different from the etching rate of the pixel element isolation film 130 due to the planarization chemicals. An amount of material removal in a central region (e.g., the active pixel region APR) of the semiconductor substrate 110 in which the density of the pixel element isolation film 130 is relatively high may be different from an amount of material removal in a peripheral region (e.g., the pad region PDR) of the semiconductor substrate 110, where the density of the pixel element isolation film 130 is relatively low. For example, when an etching rate of the pixel element isolation film 130 is less than an etching rate of the semiconductor substrate 110 in the planarization process, a region of the semiconductor substrate 110 in the pad region PDR may be removed more than a region of the semiconductor substrate 110 in the active pixel region APR and a level of the second surface 110F2 of the semiconductor substrate 110 in the pad region PDR may be lower than a level of the second surface 110F2 of the semiconductor substrate 110 in the active pixel region APR. Due to a local level difference of the second surface 110F2 of the semiconductor substrate 110, for example, a patterning failure may occur in a subsequent patterning process such as patterning of the color filter 158.

Figure 12:
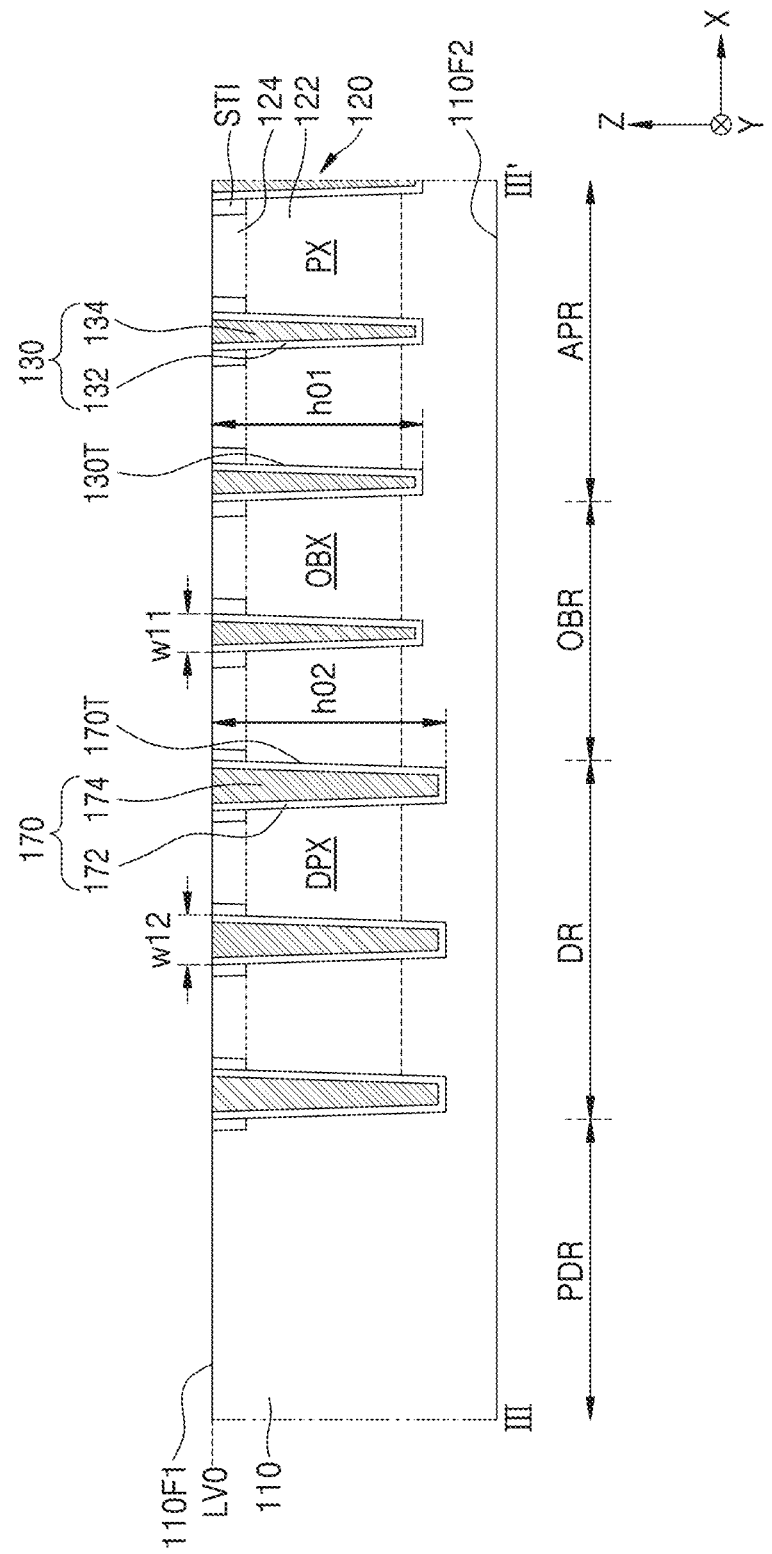
FIGS. 12, 13, 14, 15, 16, 17, 18, and 19 are cross-sectional views illustrating a method of manufacturing an image sensor according to some example embodiments.

On the other hand, according to the manufacturing method of the above-described example embodiments, the dummy element isolation film 170 may be formed to have a second width w12 which is greater than a first width w11 of the pixel element isolation film 130 and/or the dummy element isolation film 170 may be formed to have a second height h02 (see FIG. 12) that is greater than a first height h01 of the pixel element isolation film 130 (see FIG. 12). The dummy element isolation film 170 placed at the edge region of the semiconductor substrate 110 in the planarization process from the second surface 110F2 of the semiconductor substrate 110 may be first exposed through the second surface 110F2 thereof. An etching rate of the dummy element isolation film 170 may be lower than an etching rate of the semiconductor substrate 110 exposed in the active pixel region APR due to the planarization chemicals, and thus the dummy element isolation film 170 and the pad region PDR adjacent thereto may be removed relatively small. That is, the dummy element isolation film 170 may function as an etch stopping film to prevent dishing of the semiconductor substrate 110, which may be caused by a difference in pattern density between the active pixel region APR and the pad region PDR in the process of planarizing the semiconductor substrate 110. Therefore, the active pixel region APR, the dummy pixel region DR, and the pad region PDR may have a relatively flat top surface level and the patterning failure due to the level difference of the second surface 110F2 of the semiconductor substrate 110 that may occur in the subsequent patterning process may be effectively prevented.

Figure 4:
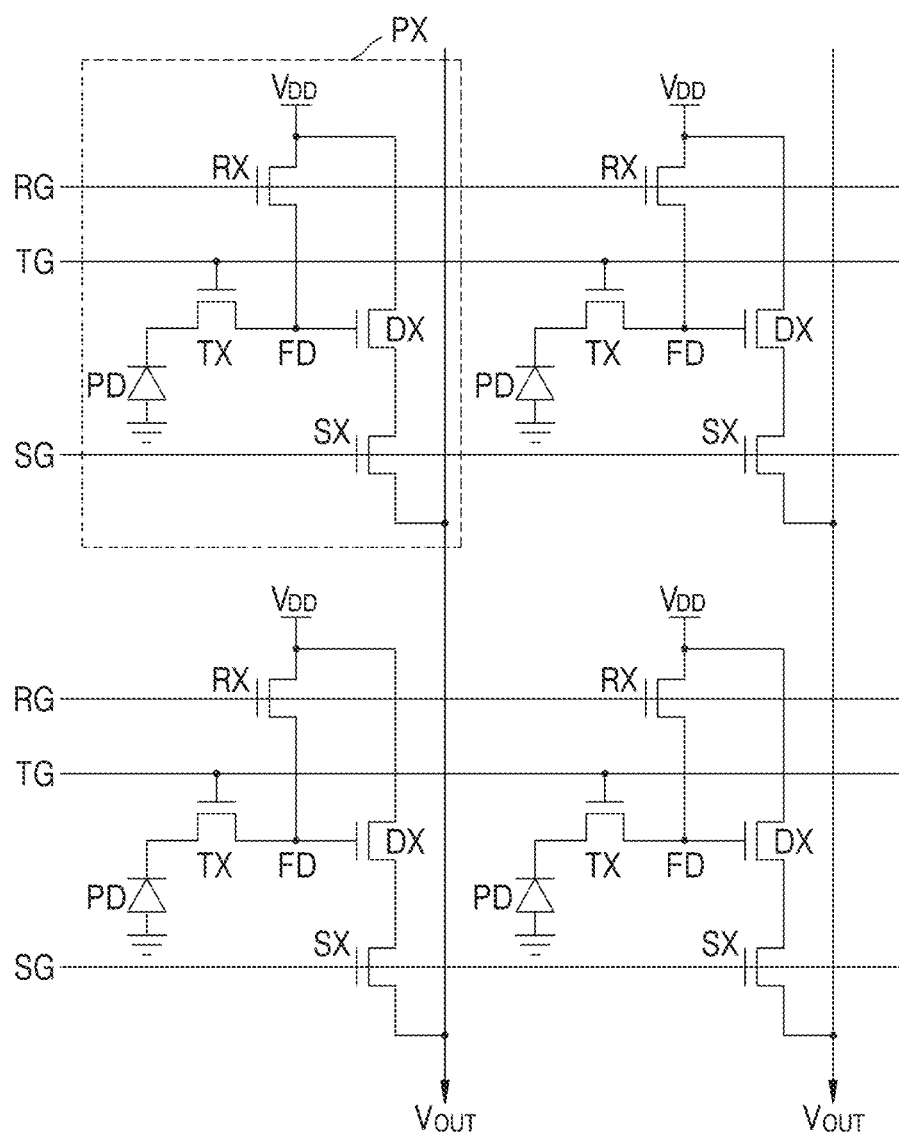
FIG. 4 is an equivalent circuit diagram of an active pixel of an image sensor according to some example embodiments.

FIG. 4 is an equivalent circuit diagram of an active pixel PX of the image sensor 100 according to some example embodiments.

Referring to FIG. 4, a plurality of active pixels PX may be arranged in a matrix form. Each of the plurality of active pixels PX may include a transfer transistor TX and logic transistors RX, SX, and DX. Here, the logic transistors may include a reset transistor RX, a selection transistor SX, and a drive transistor DX (or a source follower transistor). The reset transistor RX may include a reset gate RG, the selection transistor SX may include a selection gate SG, and the transfer transistor TX may include a transfer gate TG.

Each of the plurality of active pixels PX may further include a photoelectric conversion element PD and a floating diffusion region FD. The photoelectric conversion element PD may correspond to the photoelectric conversion region 120 described in FIGS. 1 to 3. The photoelectric conversion element PD may generate and accumulate photo charges in proportion to the amount of light incident from the outside, and the photoelectric conversion element PD may include a photodiode, a photo transistor, a photogate, a pinned photodiode (PPD), or combinations thereof.

The transfer gate TG of each of the plurality of active pixels PX may transfer the charge generated in the photoelectric conversion element PD to the floating diffusion region FD. The floating diffusion region FD may receive the charge generated in the photoelectric conversion element PD to accumulate the received charge. The drive transistor DX may be controlled according to the amount of photo charges accumulated in the floating diffusion region FD.

The reset transistor RX may periodically reset the charges accumulated in the floating diffusion region FD. A drain electrode of the reset transistor RX may be connected to the floating diffusion region FD and a source electrode thereof may be connected to the power source voltage $V_{DD}$. When the reset transistor RX is turned on, the power source voltage $V_{DD}$ connected to the source electrode of the reset transistor RX may be transferred to the floating diffusion region FD. When the reset transistor RX is turned on, the charges accumulated in the floating diffusion region FD may be discharged to reset the floating diffusion region FD.

The drive transistor DX may be connected to a current source (not illustrated) located outside a plurality of active pixels PX to function as a source follower buffer amplifier and may amplify the potential change in the floating diffusion region FD to output the amplified potential change to the output line $V_{OUT}$.

The selection transistor SX may select a plurality of active pixels PX row by row, and the power supply voltage $V_{DD}$ may be transferred to the source electrode of the drive transistor DX when the selection transistor SX is turned on.

Figure 5:
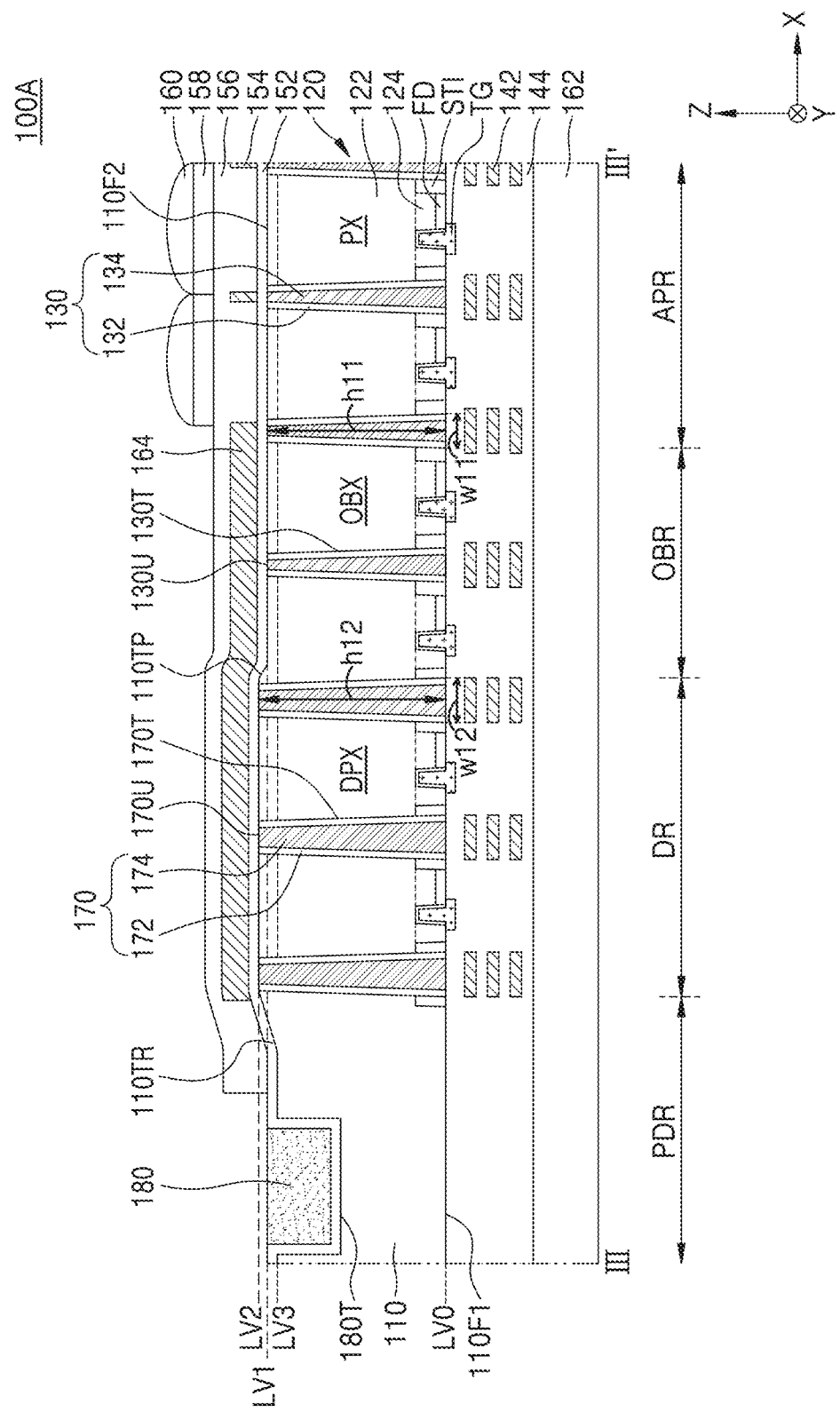
FIG. 5 is a cross-sectional view illustrating an image sensor according to some example embodiments.

FIG. 5 is a cross-sectional view illustrating an image sensor 100A according to some example embodiments. FIG. 5 is a cross-sectional view of a region corresponding to a region III-III' of FIG. 2. In FIG. 5, the same reference numerals as in FIGS. 1 to 4 denote the same components.

Referring to FIG. 5, the pixel element isolation film 130 may have a first height h11 in a third direction (Z direction) perpendicular to the first surface 110F1 of the semiconductor substrate 110, and the dummy element isolation film 170 may have a second height h12 greater than the first height h11 of the pixel element isolation film 130 in a third direction (Z direction) perpendicular to the first surface 110F1 of the semiconductor substrate 110.

The second level LV2 of the second surface 110F2 of the semiconductor substrate 110 in the dummy pixel region DR may be higher than the first level LV1 of the second surface 110F2 of the semiconductor substrate 110 in the active pixel region APR. That is, the second surface 110F2 of the semiconductor substrate 110 in the dummy pixel region DR may be placed farther from the second surface 110F2 of the semiconductor substrate 110 in the active pixel region APR on the basis of the first surface 110F1 of the semiconductor substrate 110.

In the pad region PDR, a third level LV3 of the second surface 110F2 of the semiconductor substrate 110 may be lower than the second level LV2 of the second surface 110F2 of the semiconductor substrate 110 in the dummy pixel region DR. In addition, in the pad region PDR, the third level LV3 of the second surface 110F2 of the semiconductor substrate 110 may be lower than the first level LV1 of the second surface 110F2 of the semiconductor substrate 110 in the active pixel region APR.

Accordingly, the second surface 110F2 of the semiconductor substrate 110 may have a protrusion region 110TP at the boundary between the dummy pixel region DR and the optical black region OBR, and the second surface 110F2 of the semiconductor substrate 110 in the pad region DPR may have a recess region 110TR. As shown in at least FIG. 5, therefore, the top surface 170U of the dummy element isolation film 170 exposed on the second surface 110F2 of the semiconductor substrate 110 may be distal from the first surface 110F1 of the semiconductor substrate 110 in relation to a top surface 130U of the pixel element isolation film 130 exposed on the second surface 110F2 of the semiconductor substrate 110. As further shown in FIG. 5, the second surface 110F2 of the semiconductor substrate 110 in the pad region PDR, being at level LV3, may be proximate to the first surface 110F1 of the semiconductor substrate 110 in relation to the top surface 130U of the pixel element isolation film 130. In FIG. 5, the relative positions of the first to third levels LV1, LV2 and LV3, the shapes of the protrusion region 110TP and the recess region 110TR are illustrated for convenience of understanding, but the inventive concepts are not limited thereto. For example, the first level LV1 and the third level LV3 may be the same level, or the third level LV3 may be higher than the first level LV1 and may be lower than the second level LV2. Furthermore, the profile of the protrusion region 110TP and the recess region 110TR may be more smooth or flat than that illustrated in FIG. 5.

According to the manufacturing method of the above-described example embodiments, the dummy element isolation film 170 may be formed to have a second width w12 which is greater than a first width w11 of the pixel element isolation film 130 and/or the dummy element isolation film 170 may be formed to have a second height h02 (see FIG. 12) which is greater than a first height h01 of the pixel element isolation film 130 (see FIG. 12). In the planarization process of the second surface 110F2 of the semiconductor substrate 110, the dummy element isolation film 170 placed at the edge region of the semiconductor substrate 110 may be first exposed through the second surface 110F2 thereof, and the dummy element isolation film 170 and the pad region PDR adjacent thereto may be removed relatively small in the planarization process. For example, compared to the amount of removal of the pad region PDR in an image sensor according to a comparative example in which the dummy element isolation film 170 is not formed, the amount of removal of the pad region PDR in the image sensor according to some example embodiments in which the dummy element isolation film 170 is formed may be significantly smaller.

The second surface 110F2 of the semiconductor substrate 110 and the upper surface of the dummy element isolation film 170 may be minimally removed in the dummy pixel region DR in the planarization process, and thus, the dummy element isolation film 170 may have a second height h12 that is greater than the first height h11 of the pixel element isolation film 130.

According to the above-described embodiments, the active pixel region APR, the dummy pixel region DR, and the pad region PDR may have a relatively flat top surface level, and the patterning failure due to the difference in level of the second surface 110F2 of the semiconductor substrate 110 that may occur in the subsequent patterning process may be effectively prevented.

Figure 7:
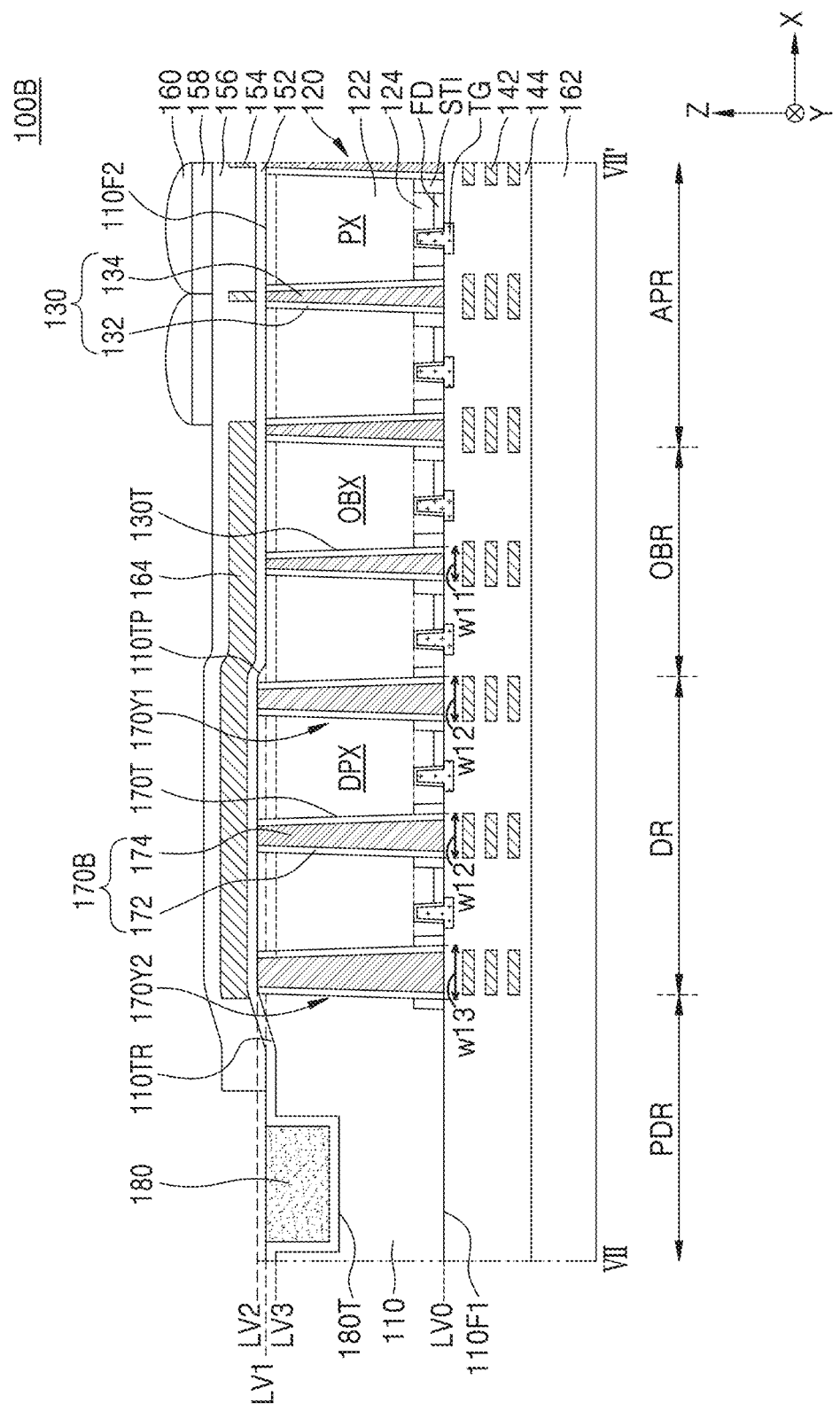
FIG. 7 is a cross-sectional view taken on line VII-VII' of FIG. 6.

FIG. 6 is a layout diagram illustrating an image sensor 100B according to some example embodiments, and FIG. 7 is a cross-sectional view of a region VII-VII' of FIG. 6. In FIGS. 6 and 7, the same reference numerals as in FIGS. 1 to 5 denote the same components.

Referring to FIGS. 6 and 7, the dummy element isolation film 170B may include a plurality of first dummy lines 170X1 and 170X2 extending in the X direction and a plurality of second dummy lines 170Y1 and 170Y2 extending in the Y direction. The plurality of first dummy lines 170X1 and 170X2 may include a first narrow-width dummy line 170X1 and a first wide-width dummy line 170X2, and the plurality of second dummy lines 170Y1 and 170Y2 may include a second narrow-width dummy line 170Y1 and a second wide-width dummy line 170Y2. For example, the second narrow-width dummy line 170Y1 may have, at level LV0 (e.g., the same level as the first surface 110F1 of the semiconductor substrate 110), a second width w12 along the first direction (X direction) and the second wide-width dummy line 170Y2 may have, at level LV0 (e.g., the same level as the first surface 110F1 of the semiconductor substrate 110), a third width w13 greater than the second width w12 along the first direction, where second width w12 may be the same as the second width w12 of the first end 170A of the dummy element isolation film 170. Both the second width w12 and the third width w13 may be greater than the first width w11 of the pixel element isolation film 130. In addition, a width of the first narrow-width dummy line 170X1 along the second direction (Y direction) may be less than a width of the first wide-width dummy line 170X2 along the second direction (Y direction) and may be greater than the width of the pixel element isolation film 130 along the second direction (Y direction).

In example embodiments, the other at least one wide-width dummy line 170Y2 may be placed at an edge of the dummy element isolation film 170B and the at least one second narrow-width dummy line 170Y1 may be placed between the at least one second wide-width dummy line 170Y2 and the pixel element isolation film 130.

The dummy element isolation film 170B has the second width w12 and the third width w13 which are greater than the first width w11 of the pixel element isolation film 130, and the dummy element isolation film 170B may be formed to have a second height h02 (see FIG. 12) that is greater than the first height h01 of the pixel element isolation film 130 (see FIG. 12). In the planarization process of the second surface 110F2 of the semiconductor substrate 110, the dummy element isolation film 170B placed at the edge region of the semiconductor substrate 110 may first be exposed through the second surface 110F2 thereof, and the dummy element isolation film 170B and the pad region PDR adjacent thereto may be removed relatively small in the planarization process. For example, in an image sensor according to some example embodiments in which the dummy element isolation film 170B is formed, the amount by which the pad region PDR is removed may be significantly less compared with the amount of removal of the pad region PDR in the image sensor according to a comparative example in which the dummy element isolation film 170B is not formed.

Therefore, the active pixel region APR, the dummy pixel region DR, and the pad region PDR may have a relatively flat top surface level, and the patterning failure due to the difference in level of the second surface 110F2 of the semiconductor substrate 110 that occurs in the subsequent patterning process may be effectively prevented.

Figure 8:
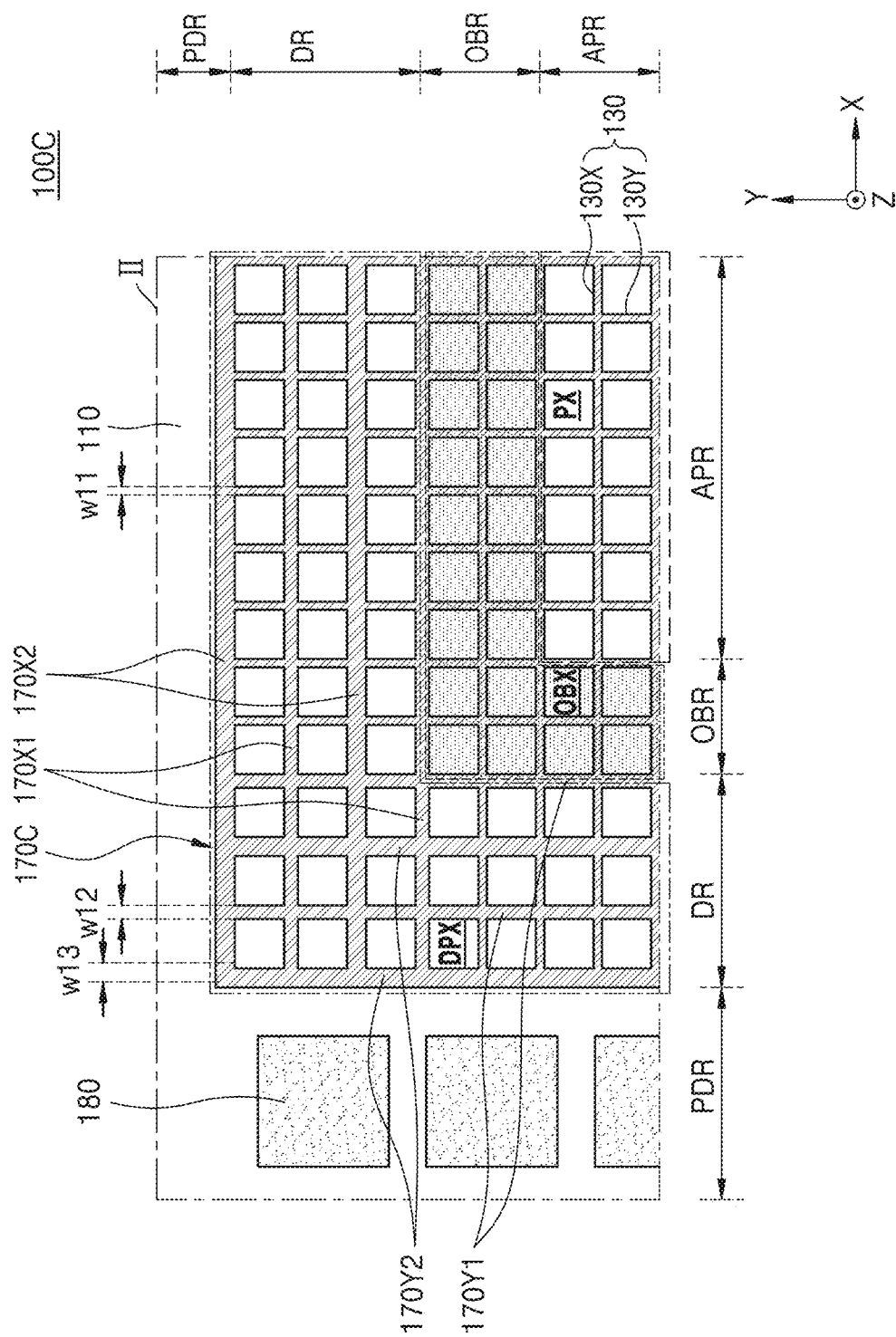
FIG. 8 is a layout diagram illustrating an image sensor according to some example embodiments.

FIG. 8 is a layout diagram illustrating an image sensor 100C according to some example embodiments. In FIG. 8, the same reference numerals as in FIGS. 1 to 7 denote the same components.

Referring to FIG. 8, the dummy element isolation film 170C may include a plurality of first dummy lines 170X1 and 170X2 extending in the X direction and a plurality of second dummy lines 170Y1 and 170Y2 extending in the Y direction. The plurality of first dummy lines 170X1 and 170X2 may include first narrow-width dummy lines 170X1 and first wide-width dummy lines 170X2. As shown in FIG. 8, the first narrow-width dummy lines 170X1 and the first wide-width dummy lines 170X2 may be alternately arranged along the Y direction (e.g., the second direction). The plurality of second dummy lines 170Y1 and 170Y2 may include second narrow-width dummy lines 170Y1 and second wide-width dummy lines 170Y2. The second narrow-width dummy lines 170Y1 and the second wide-width dummy lines 170Y2 may be alternately arranged along the X direction (e.g., the first direction).

Figure 9:
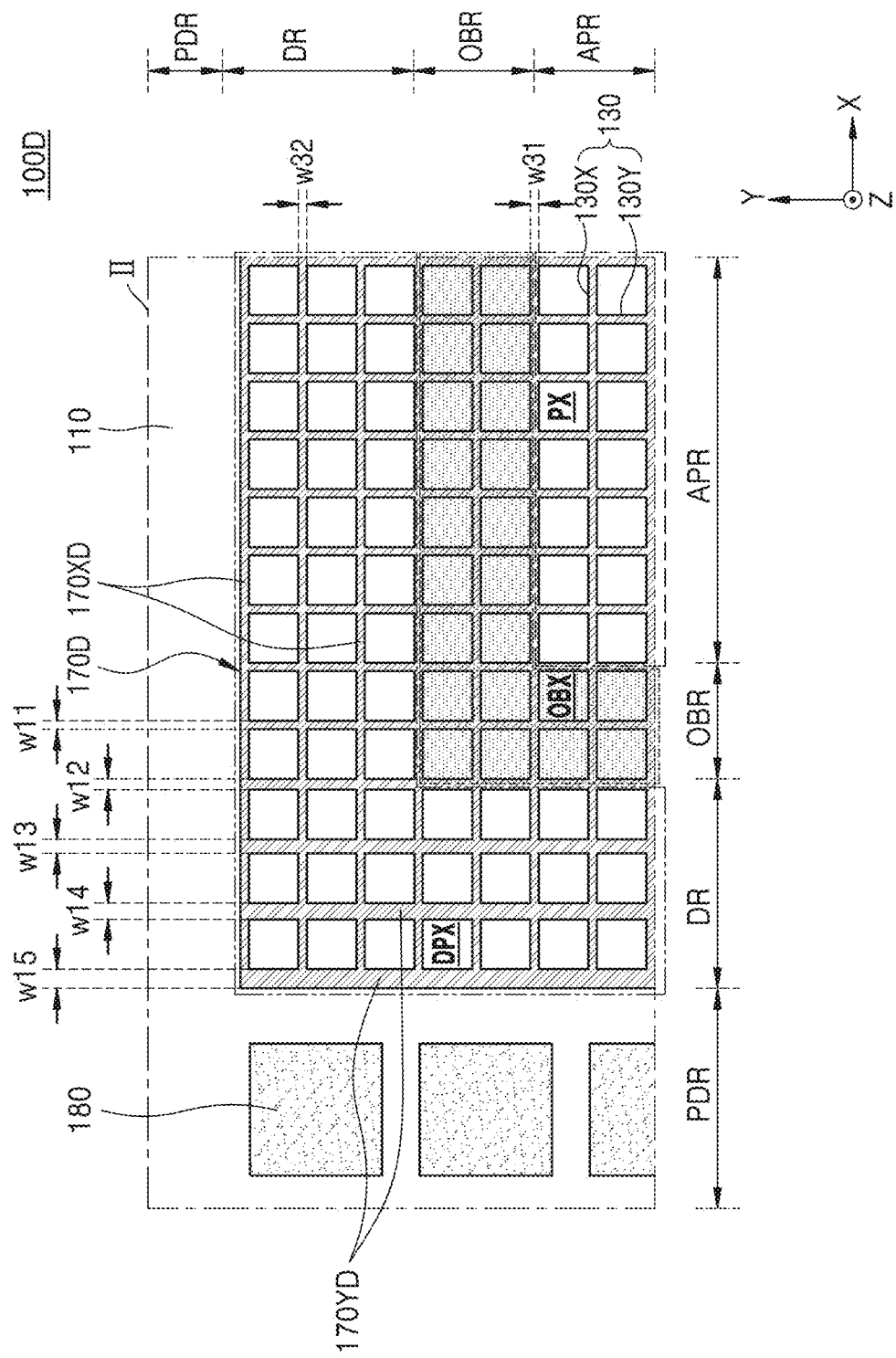
FIG. 9 is a layout diagram illustrating an image sensor according to some example embodiments.

FIG. 9 is a layout diagram illustrating an image sensor 100D according to some example embodiments. In FIG. 9, the same reference numerals as in FIGS. 1 to 8 denote the same components.

Referring to FIG. 9, the dummy element isolation film 170D may include a plurality of first dummy lines 170XD extending in the X direction and a plurality of second dummy lines 170YD extending in the Y direction. The plurality of first dummy lines 170XD may have substantially the same width as a first pixel isolation line 130X of the pixel element isolation film 130. For example, the first pixel isolation line 130X has a first width w31 in a second direction (Y direction), and the first dummy line 170XD has a second width w32 that is substantially the same as a first width w31.

The plurality of second dummy lines 170YD may be greater than a width w11 along the first direction (X direction) of the second pixel isolation line 130Y of the pixel element isolation film 130 and may have variable widths w12, w13, w14, and w15. For example, as the plurality of second dummy lines 170YD are away from the second pixel isolation line 130Y which is at the outermost region, the plurality of second dummy lines 170YD may have gradually increasing widths w12, w13, w14, and w15. A width w15 of second dummy line 170YD placed farthest from the second pixel isolation line 130Y which is at the outermost region may be greater than a width w12 of the second dummy line 170YD closest to the second pixel isolation line 130Y which is at the outermost region. Restated, each given second dummy line 170YD may have a width that is proportional to a distance of the given second dummy line 170YD from the active pixels PX.

In other embodiments, unlike that illustrated in FIG. 9, a plurality of second dummy lines 170YD may have substantially the same width as the second pixel isolation line 130Y of the pixel element isolation film 130, and the plurality of first dummy lines 170XD may be greater than a width w31 along the second direction (Y direction) of the first pixel isolation line 130X of the pixel element isolation film 130 and may have a variable width.

In another embodiments, unlike that illustrated in FIG. 9, the plurality of second dummy lines 170YD may have substantially the same width as the second pixel isolation line 130Y of the pixel element isolation film 130, and the plurality of first dummy lines 170XD may be greater than the width w31 along the second direction (Y direction) of the first pixel isolation line 130X of the pixel element isolation film 130 and may have the same width w32.

In still another embodiments, unlike that illustrated in FIG. 9, the plurality of first dummy lines 170XD may have substantially the same width as the first pixel isolation line 130X of the pixel element isolation film 130 and the plurality of second dummy lines 170YD may be greater than the width w11 along the first direction (X direction) of the second pixel isolation line 130Y of the pixel element isolation film 130 and may have the same width w12.

Figure 10:
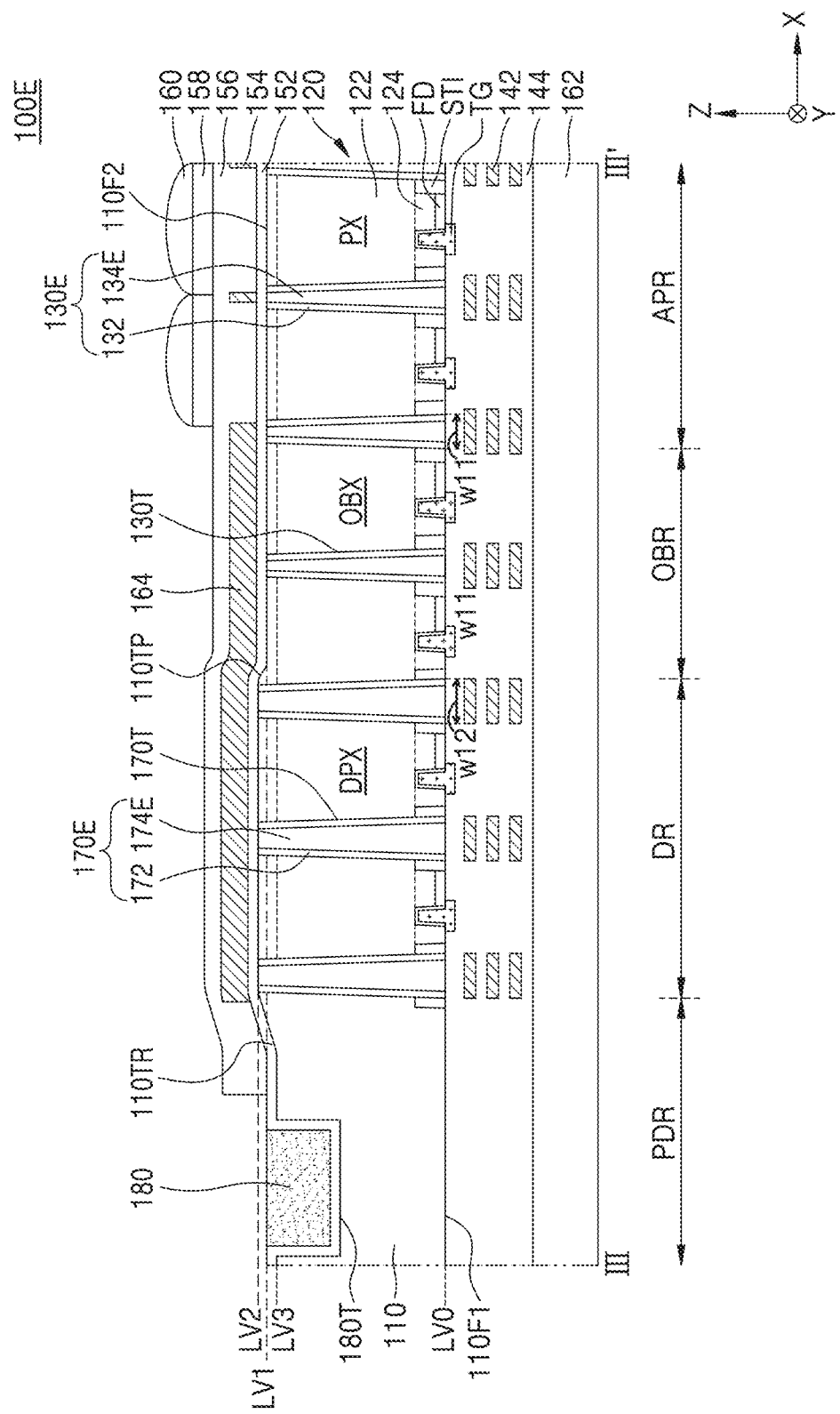
FIG. 10 is a cross-sectional view illustrating an image sensor according to some example embodiments.

FIG. 10 is a cross-sectional view illustrating an image sensor 100E according to some example embodiments. FIG. 10 is a cross-sectional view corresponding to a part III-III' of FIG. 2. In FIG. 10, the same reference numerals as in FIGS. 1 to 89 denote the same components.

Referring to FIG. 10, the pixel element isolation film 130E may include an insulating liner 132 formed to be conformally formed on the inner sidewall of the pixel trench 130T, a buried insulating layer 134E filling the inside region of the pixel trench 130T on the insulating liner 132. In example embodiments, the buried insulating layer 134E may include an insulating material such as silicon oxide, silicon nitride, silicon oxynitride, or a low-k dielectric material. In other embodiments, the buried insulating layer 134E may include a metal oxide such as hafnium oxide, aluminum oxide, or tantalum oxide.

The dummy element isolation film 170E may include a dummy insulating liner 172 formed on the sidewalls of the dummy trench 170T and a dummy buried insulating layer 174E filling the inside of the dummy trench 170T on the dummy insulating liner 172. In example embodiments, the dummy buried insulating layer 174E may include an insulating material such as silicon oxide, silicon nitride, silicon oxynitride, or a low-k dielectric material. In other embodiments, the dummy buried insulating layer 174E may include a metal oxide such as hafnium oxide, aluminum oxide, or tantalum oxide. The insulating liner 132 and the dummy insulating liner 172 may be a material layer formed in the same process and the buried insulating layer 134E and the dummy buried insulating layer 174E may be a material layer formed in the same process. In some example embodiments, the dummy buried insulating layer 174E may have a same material composition as the buried insulating layer 134E.

According to the manufacturing method of the above-described example embodiments, even though an etching rate of the insulating material in the pixel element isolation film 130E is less than an etching rate of the semiconductor substrate 110 in the planarization process from the second surface 110F2 of the semiconductor substrate 110, the dummy element isolation film 170E placed at the edge region of the semiconductor substrate 110 may be first exposed through the second surface 110F2. Therefore, since the dummy element isolation film 170E and the pad region PDR adjacent thereto are removed relatively small, the active pixel region APR, the dummy pixel region DR, and the pad region PDR adjacent thereto may have a relatively flat top surface level. Therefore, the patterning failure due to the level difference of the second surface 110F2 of the semiconductor substrate 110 which occurs in the subsequent patterning process may be effectively prevented.

Figure 11:
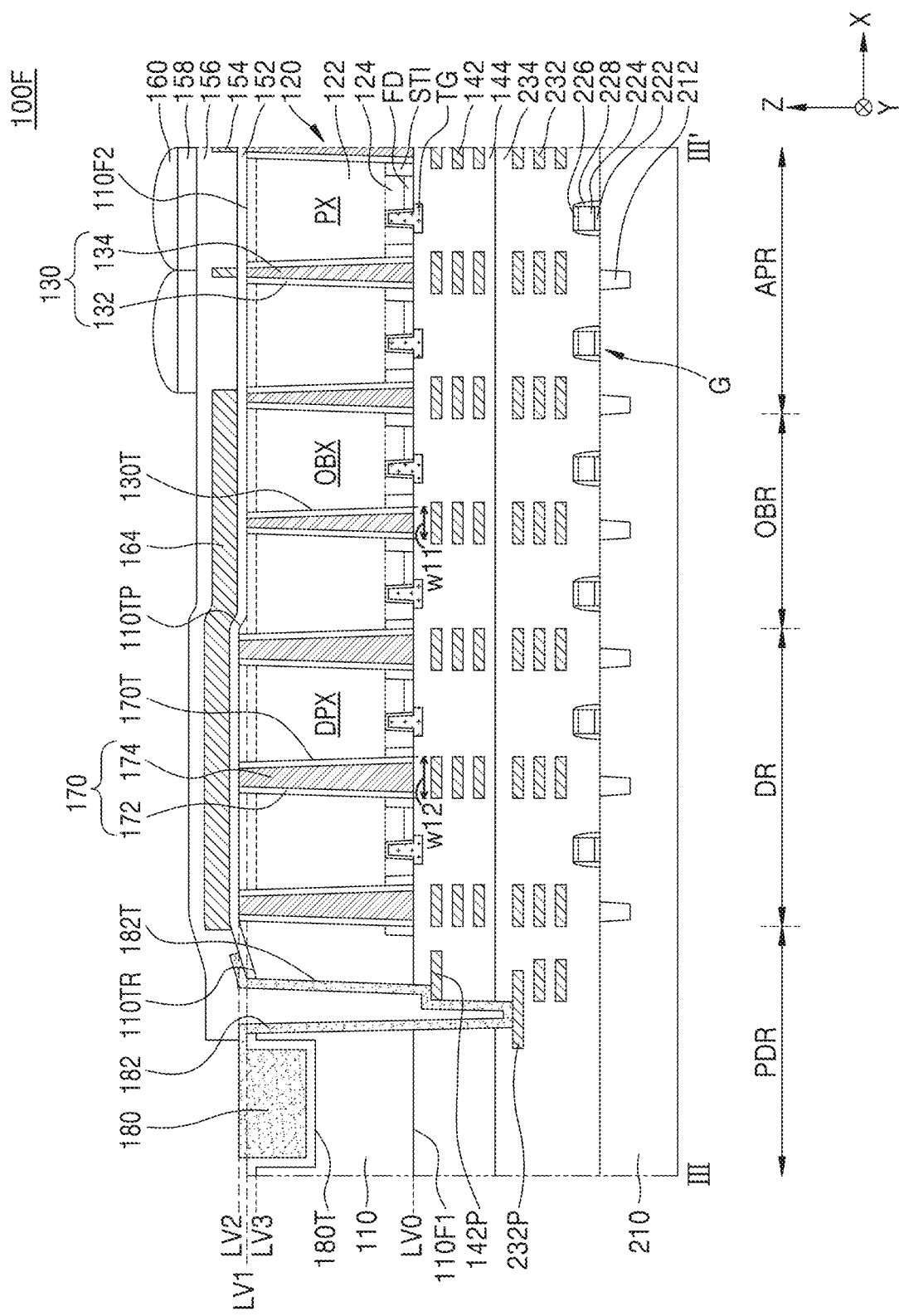
FIG. 11 is a cross-sectional view illustrating an image sensor according to some example embodiments.

FIG. 11 is a cross-sectional view illustrating an image sensor 100F according to some example embodiments. FIG. 11 is a cross-sectional view corresponding to a part III-III' of FIG. 2. In FIG. 11, the same reference numerals as in FIGS. 1 to 10 denote the same components.

Referring to FIG. 11, the image sensor 100F may have a stacked structure in which a semiconductor substrate 110 and a lower substrate 210 are bonded to each other.

An active region (not illustrated) defined by a device isolation film 212 may be formed on the lower substrate 210. A gate structure G may be placed on the lower substrate 210. The gate structure G may include a gate insulating layer 222, a gate electrode 224, and a gate capping layer 226 that are sequentially placed on a top surface of the lower substrate 210. The gate structure G may further include a spacer 228 placed on the sidewalls of the gate insulating layer 222, the gate electrode 224, and the gate capping layer 226.

The gate structure G may constitute a plurality of CMOS transistors for providing a given signal in each photoelectric conversion region 120 of the active pixel region APR or controlling an output signal in each photoelectric conversion region 120. For example, the transistor may include a variety of logic circuits such as a timing generator, a row decoder, a row driver, a correlated double sampler (CDS), an analog to digital converter (ADC), a latch unit, and a column decoder, but the inventive concepts is not limited thereto.

A second internal wiring structure 232 may be formed on the lower substrate 210. The second internal wiring structure 232 may be formed as a laminated structure of a plurality of layers. A second interlayer insulating film 234 may be placed on the lower substrate 210 to cover the gate structure G and the second internal wiring structure 232.

The first interlayer insulating film 144 may be attached to the second interlayer insulating film 234. In example embodiments, the first interlayer insulating film 144 and the second interlayer insulating film 234 may be attached to each other by an oxide-oxide direct bonding method. In other embodiments, an adhesive member (not illustrated) may be interposed between the second interlayer insulating films 234 and the first interlayer insulating film 144.

A through via trench 182T may penetrate the semiconductor substrate 110 and the first interlayer insulating film 144 and may be connected to a region of the second internal wiring structure 232. As illustrated by way of example in FIG. 11, a through vias 182 may be conformally placed on the inner walls of through via trenches 182T and the passivation layer 156 on the through vias 182 may fill the remaining region of the through via trenches 182T. In contrast, the through vias 182 may completely fill the interior of the through via trenches 182T. The through vias 182 may be connected to both the first internal wiring structure 142 and the second internal wiring structure 232 and a bottom region of the through vias 182 may be surrounded by the second interlayer insulating film 234.

FIGS. 12, 13, 14, 15, 16, 17, 18, and 19 are cross-sectional views illustrating a manufacturing method of the image sensor 100A according to some example embodiments. FIGS. 12 to 19 illustrate cross-sections corresponding to the III-III' cross-section of FIG. 2 according to the process sequence. In FIGS. 12 to 19, the same reference numerals as in FIGS. 1 to 11 denote the same components.

Referring to FIG. 12, a semiconductor substrate 110 having a first surface 110F1 and a second surface 110F2 opposite to each other is prepared.

A photoelectric conversion region 120 including a photodiode region 122 and a well region 124 may be formed from the first surface 110F1 of the semiconductor substrate 110 by an ion implantation process. For example, the photodiode region 122 may be formed by doping with an N-type impurity, and the well region 124 may be formed by doping with a P-type impurity.

Thereafter, a mask pattern (not illustrated) is formed on the first surface 110F1 of the semiconductor substrate 110, and an element isolation trench (not illustrated) is formed in the semiconductor substrate 110 using the mask pattern as an etch mask. An insulating material may be filled in the device isolation trench and the semiconductor substrate 110 may be planarized until the top surface of the first surface 110F1 of the semiconductor substrate 110 is exposed to form the device isolation film STI.

Afterwards, a mask pattern (not illustrated) may be formed on the first surface 110F1 of the semiconductor substrate 110 and the pixel trench 130T and the dummy trench 170T may be formed in the semiconductor substrate 110 using the mask pattern as an etch mask.

The pixel trench 130T may have a first height h01 from the first surface 110F1 of the semiconductor substrate 110 and may have a first width w11 along the first direction (X direction). The pixel trench 130T may have a grid shape in a plan view. That is, the pixel trench 130T may extend along a plurality of first regions (not illustrated) and a second direction (Y direction) extending along the first direction (X direction) and may include a plurality of second regions (not illustrated) connected with a plurality of first regions (not illustrated).

The dummy trench 170T may have a second height h02 from the first surface 110F1 of the semiconductor substrate 110 and the second height h02 may be greater than the first height h01. The dummy trench 170T may have a second width w12 along the first direction (X direction), and the second width w12 may be greater than the first width w11. In example embodiments, the second width w12 may be from about 110% to about 200% of the first width w11, but is not limited thereto. Furthermore, the second height h02 may be about 105% to about 150% of the first height h01, but is not limited thereto.

The dummy trenches 170T may have a shape that surrounds the pixel trenches 130T when viewed in a plan view. That is, the dummy trench 170T may include a plurality of first regions (not illustrated) extending along the first direction (X direction) and a plurality of second regions (not illustrated) connected to a plurality of first regions (not illustrated). The second region of the dummy trench 170T may be connected to the first region of the pixel trench 130T and the first region of the dummy trench 170T may be connected to the second region of the pixel trench 130T.

Afterwards, an insulating layer (not illustrated) may be conformally formed on the first surface 110F1 of the semiconductor substrate 110, the inner wall of the pixel trench 130T and the inner wall of the dummy trench 170T by a chemical vapor deposition (CVD) process, an atomic layer deposition (ALD) process. Thereafter, a conductive layer (not illustrated) filling the inner wall of the pixel trench 130T and the inner wall of the dummy trench 170T may be formed on the insulating layer, and a region of the insulating layer and a region of the conductive layer may be removed until the top surface of the first surface 110F1 of the semiconductor substrate 110 is exposed. Accordingly, the insulating liner 132 and the buried conductive layer 134 may remain on the inner wall of the pixel trench 130T and the dummy insulating liner 172 and the dummy buried conductive layer 174 may remain on the inner wall of the dummy trench 170T.

In this case, the insulating liner 132 and the buried conductive layer 134 formed on the inner wall of the pixel trench 130T may be referred to as the pixel element isolation film 130, and the dummy insulating liner 172 and the dummy insulating liner 172 that are formed on the inner wall of the dummy trench 170T may be referred to as a dummy element isolation film 170. The insulating liner 132 and the dummy insulating liner 172 may be connected at a point where the pixel trench 130T meets the dummy trench 170T (or at an intersection of the pixel trench 130T and the dummy trench 170T). In addition, the buried conductive layer 134 and the dummy buried conductive layer 174 may be connected at the point where the pixel trench 130T and the dummy trench 170T meet (or at the intersection of the pixel trench 130T and the dummy trench 170T).

As in the above-described method, since the insulating liner 132 and the dummy insulating liner 172 are formed in the same process, the insulating liner 132 and the dummy insulating liner 172 may include substantially the same material. Also, since the buried conductive layer 134 and the dummy buried conductive layer 174 are formed in the same process, the buried conductive layer 134 and the dummy buried conductive layer 174 may include substantially the same material.

Figure 13:
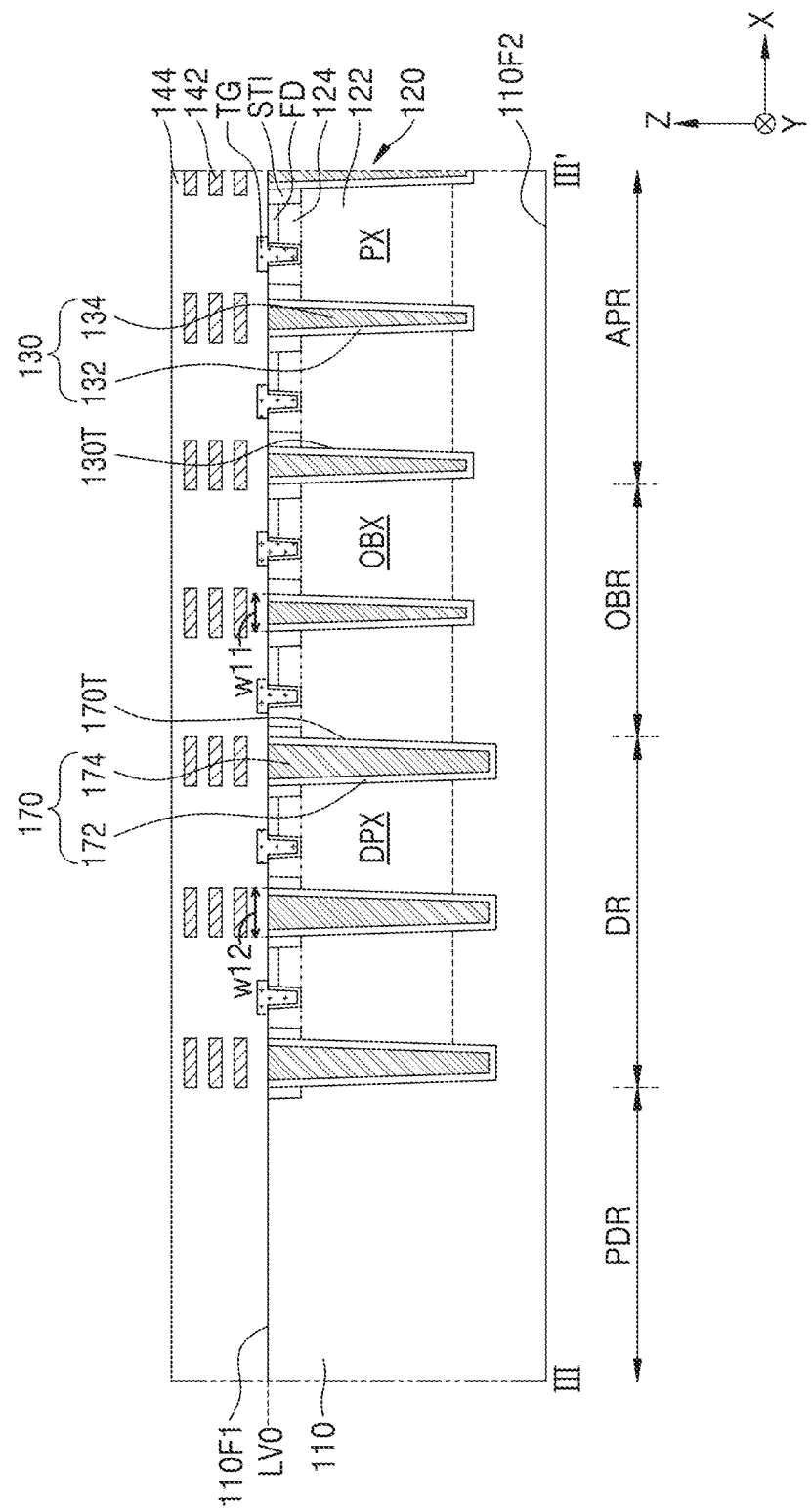

Referring to FIG. 13, a gate structure including a transfer gate TG is formed on a first surface 110F1 of a semiconductor substrate 110 and a gate structure is formed on a first surface 110F1 of the semiconductor substrate 110. An ion implantation process may be performed to form the floating diffusion region FD and the active region (not illustrated).

Afterwards, the first internal wiring structure 142 and the first interlayer insulating film 144 covering the first internal wiring structure 142 may be formed by repeatedly performing an operation of forming a conductive layer (not shown) on the first surface 110F1 of the semiconductor substrate 110, an operation of patterning the conductive layer, and an operation of forming an insulating layer (not shown) to cover the patterned conductive layer.

Figure 14:
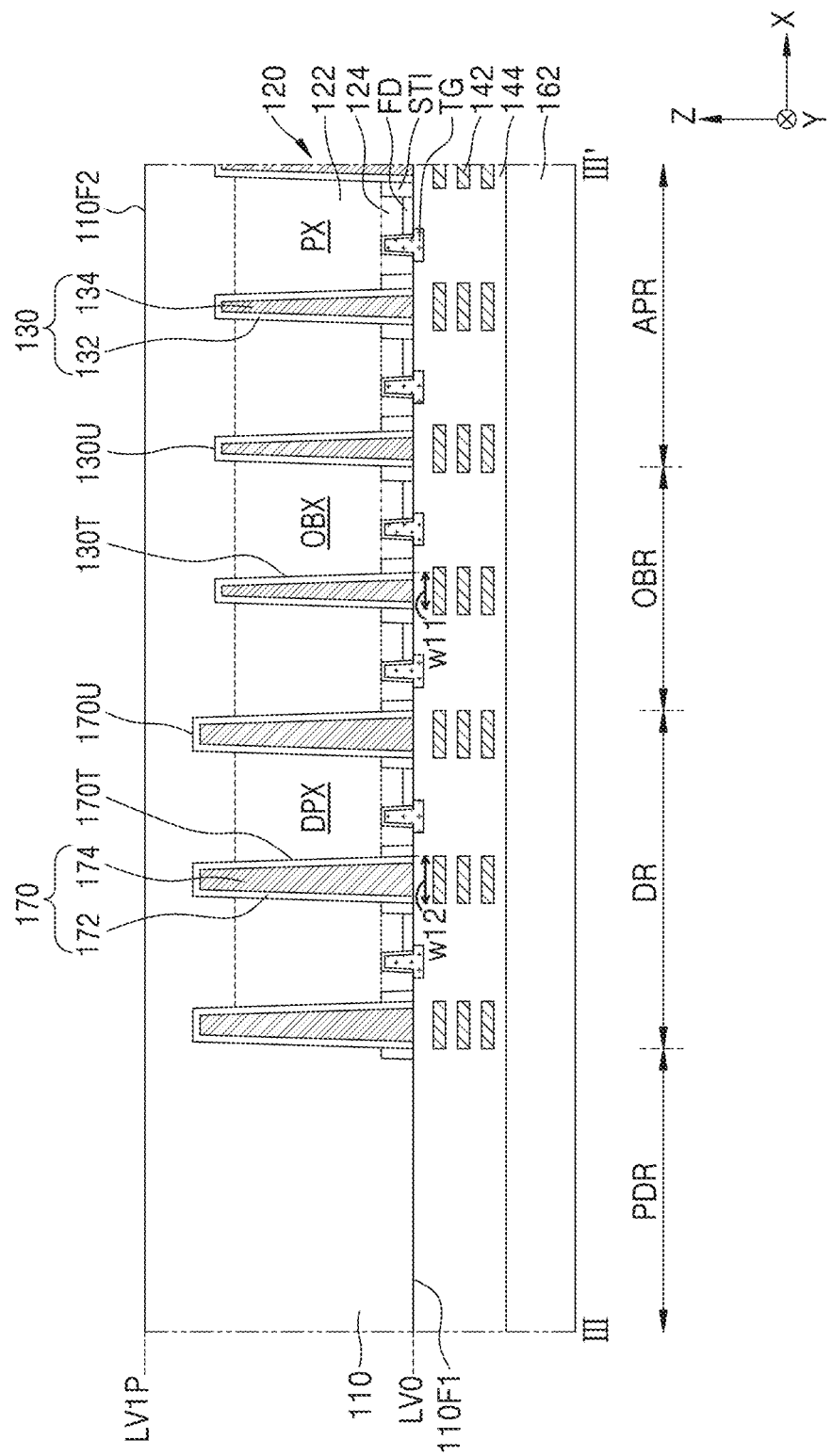

Referring to FIG. 14, a support substrate 162 may be adhered onto the first surface 110F1 of the semiconductor substrate 110. Thereafter, the semiconductor substrate 110 may be turned upside down such that the second surface 110F2 of the semiconductor substrate 110 faces upward.

Here, a surface of the pixel element isolation film 130 farthest from the first surface 110F1 of the semiconductor substrate 110 may be referred to as a top surface 130U of the pixel element isolation film 130, and the surface of the dummy element isolation film 170 farthest from the first surface 110F1 of the semiconductor substrate 110 may be referred to as a top surface 170U of the dummy element isolation film 170. The top surface 130U of the pixel element isolation film 130 and the top surface 170U of the dummy element isolation film 170 may be placed at a level lower than a level LV1P of the second surface 110F2 of the semiconductor substrate 110 and may not be exposed to the second surface 110F2 of the semiconductor substrate 110.

Figure 15:
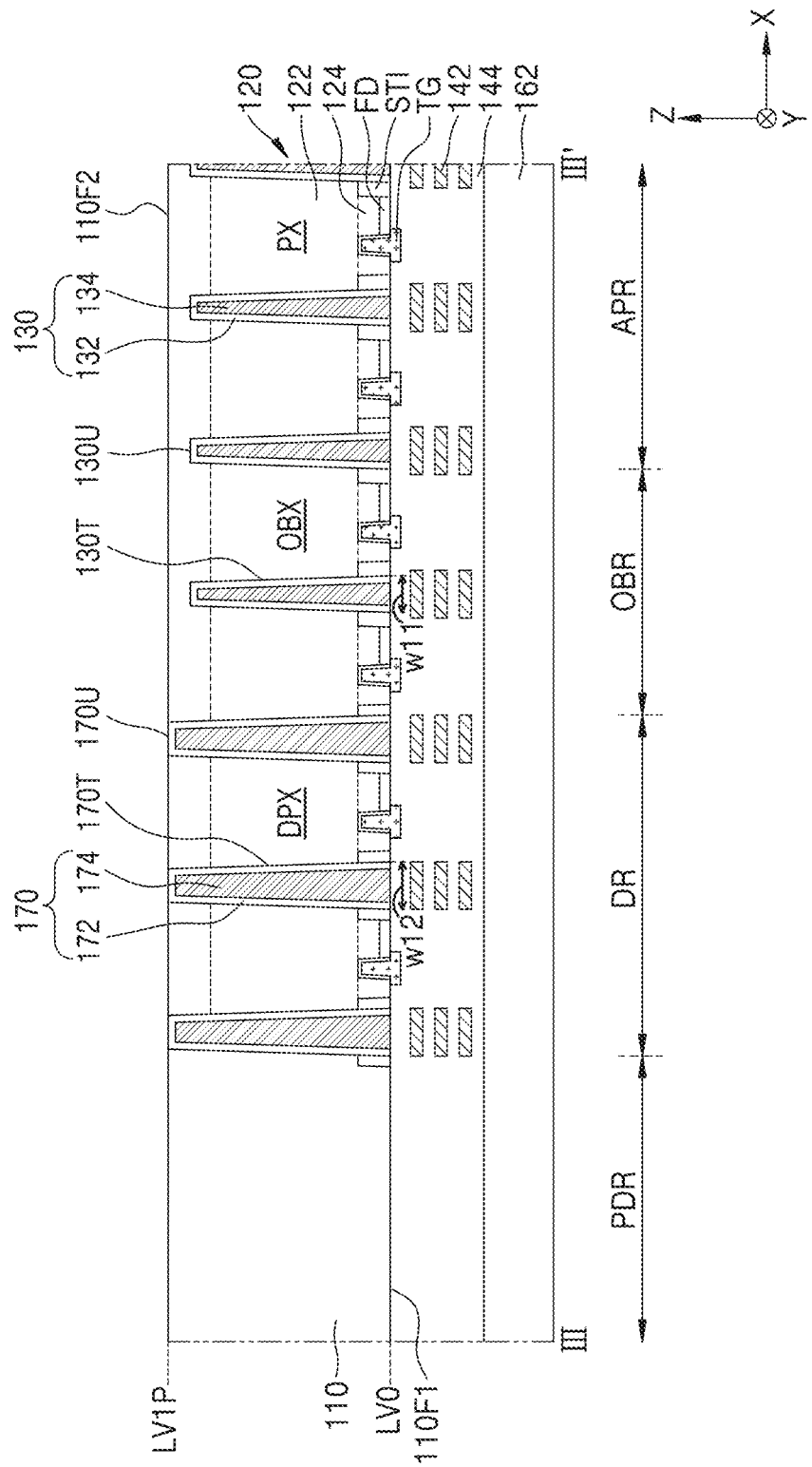

Referring to FIG. 15, a region of the semiconductor substrate 110 may be removed from the second surface 110F2 of the semiconductor substrate 110 by a planarization process such as a CMP process or an etch-back process until the top surface 170U of the dummy element isolation film 170 is exposed. As the removal process is performed, the level LV1P of the second surface 110F2 of the semiconductor substrate 110 may be lowered.

As described above, the dummy trenches 170T may have a greater width w12 and a greater height h02 than those of the pixel trenches 130T. Thus, the top surface 130U of the pixel element isolation film 130 may not be exposed to a second surface 110F2 when the top surface 170U of the dummy element isolation film 170 is exposed in the planarization process.

Figure 16:
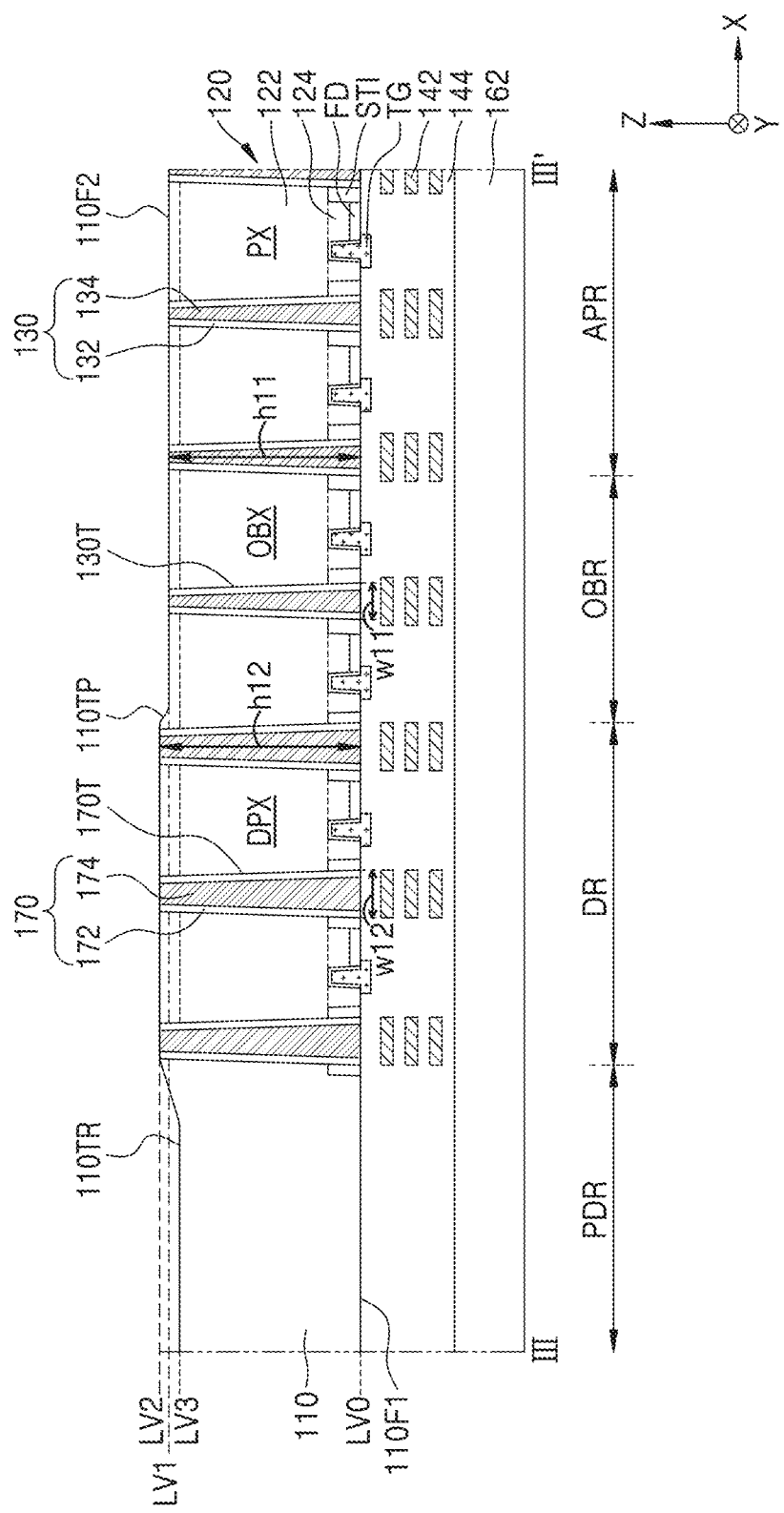

Referring to FIG. 16, the top surface 130U (see FIG. 15) of the pixel element isolation film 130 is exposed, and in particular, a part of the semiconductor substrate 110 may be removed from the second surface 110F2 of the semiconductor substrate 110 by the planarization process such as the CMP process or the etch-back process until the top surface of the buried conductive layer 134 is exposed.

One active pixel PX surrounded by the pixel element isolation film 130 may be physically and electrically separated from another active pixel PX adjacent thereto. The pixel element isolation film 130 may extend from the first surface 110F1 to the second surface 110F2 of the semiconductor substrate 110 and may have a first height h11 along the vertical direction (Z direction). The first height h11 of the pixel element isolation film 130 may be substantially the same as the height of the semiconductor substrate 110.

The dummy element isolation film 170 may extend from the first surface 110F1 to the second surface 110F2 of the semiconductor substrate 110 and may have a second height h12 along the vertical direction (Z direction). The second height h12 of the dummy element isolation film 170 may be higher than the first height h11 of the pixel element isolation film 130.

Since the second width w12 of the dummy element isolation film 170 is greater than the first width w11 of the pixel element isolation film 130, a second level LV2 of the second surface 110F2 of the semiconductor substrate 110 adjacent to the dummy element isolation film 170 may be higher than a first level LV1 of the second surface 110F2 of the semiconductor substrate 110 adjacent to the pixel element isolation film 130, and the second surface 110F2 of the semiconductor substrate 110 may have a protrusion region 110TP at the boundary between the dummy element isolation film 170 and the pixel element isolation film 130.

In addition, a third level LV3 of the second surface 110F2 of the semiconductor substrate 110 in the pad region PDR may be lower than a second level LV2 of the second surface 110F2 of the semiconductor substrate 110 adjacent to the dummy element isolation film 170, and the second surface 110F2 of the semiconductor substrate 110 may have a recess region 110TR at the boundary between the dummy element region DR and the pad region PDR.

In general, the etching rate of the semiconductor substrate 110 due to the planarization chemicals may be different from the etching rate of the pixel element isolation film 130 by the planarization chemical in the planarization process, and due to the difference in pattern density, dishing may occur where the top surface levels in the central region and the peripheral region of the semiconductor substrate 110 are different. For example, when the material removal amount in the central region (e.g., the active pixel region APR) of the semiconductor substrate 110 in which the density of the pixel element isolation film 130 is relatively high may be different from the material removal amount in the peripheral region (e.g., the pad region PDR) of the semiconductor substrate 110 in which the density of the pixel element isolation film 130 is relatively low. When the etching rate of the pixel element isolation film 130 is less than the etching rate of the semiconductor substrate 110 in the planarization process, a region of the semiconductor substrate 110 in the pad region PDR may be removed more than a region of the semiconductor substrate 110 in the active pixel region APR and a level of the second surface 110F2 of the semiconductor substrate 110 in the pad region PDR may be lower than a level of the second surface 110F2 of the semiconductor substrate 110 in the active pixel region APR. Due to the relatively large local level difference of the second surface 110F2 of this semiconductor substrate 110, for example, a patterning failure may occur in a subsequent patterning process such as patterning of the color filter 158.

On the contrary, according to the manufacturing method of the example embodiments, the dummy element isolation film 170 may be first exposed through the second surface 110F2 in the planarization process. In the dummy element isolation film 170, the etching rate by the planarizing chemical may be lower than the etching rate of the semiconductor substrate 110 exposed in the active pixel region APR, and thus the dummy element isolation film 170 and the pad region PDR adjacent thereto may be removed relatively small. The protrusion region 110TP and the recess region 110TR are formed on the second surface 110F2 of the semiconductor substrate 110 but the second surface 110F2 of the semiconductor substrate 110 is relatively flat and has a smooth upper surface level. The defective patterning in the subsequent patterning process may be prevented.

Figure 17:
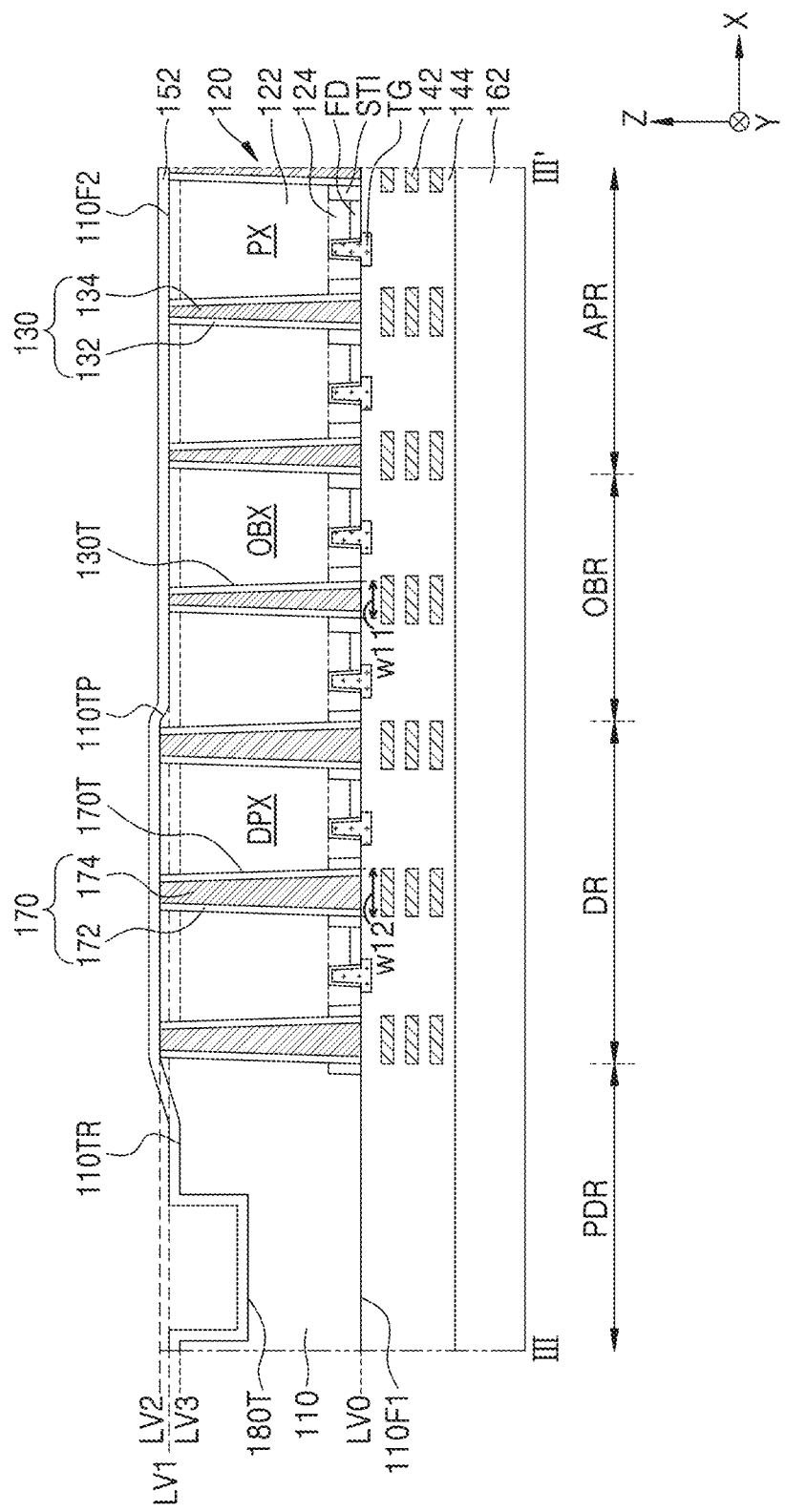

Referring to FIG. 17, a region of the semiconductor substrate 110 may be removed in the pad region PDR to form a pad recess 180T.

Afterwards, a rear insulating layer 152 may be formed on the second surface 110F2 of the semiconductor substrate 110. The rear insulating layer 152 may be conformally formed on the inner wall of the pad recess 180T to cover the pixel element isolation film 130 and the dummy element isolation film 170.

Figure 18:
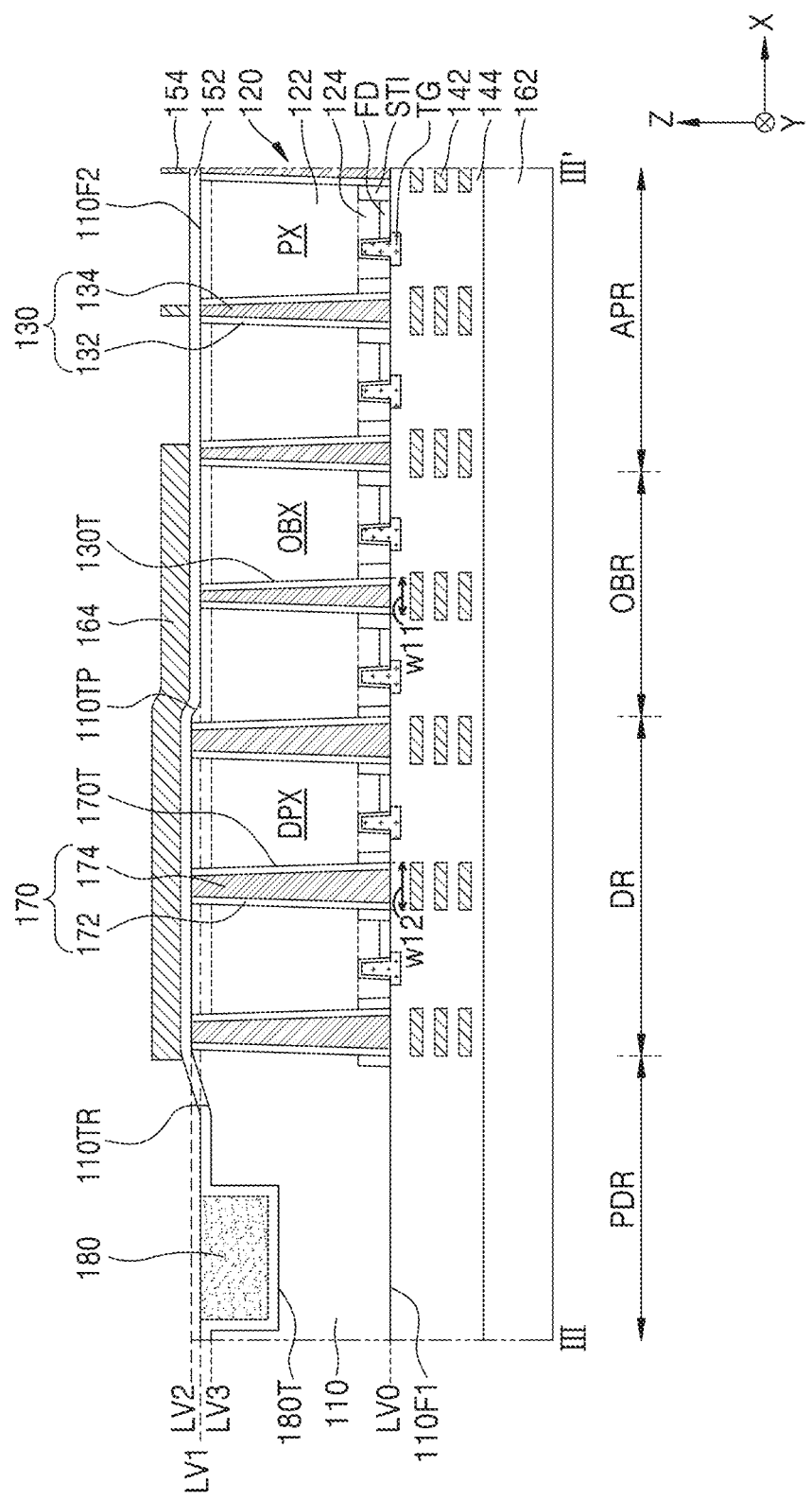

Referring to FIG. 18, a conductive layer (not illustrated) may be formed on the rear insulating layer 152, and the conductive pattern may be patterned to form the guide pattern 154 and the light blocking layer 164. The guide pattern 154 may be formed to overlap the pixel element isolation film 130 in the active pixel region APR. The light blocking layer 164 may be formed to cover the entire top surface of the optical black pixel OBX in the optical black region OBR and may be placed on at least a part of the dummy pixel region DR.

Thereafter, the conductive pad 180 may be formed by filling conductive material in the pad recess 180T. The conductive pad 180 may be formed by sequentially forming a first metal layer (not illustrated) and a second metal layer (not illustrated). For example, the first metal layer may be formed using a metal material such as titanium, titanium nitride, tantalum, tantalum nitride, titanium tungsten, tungsten, aluminum, cobalt, nickel or copper by a CVD process, an ALD process, or the like. The second metal layer may be formed using a metal material such as tungsten, aluminum, cobalt, nickel, or copper by a CVD process, an ALD process, a plating process, or the like.

Figure 19:
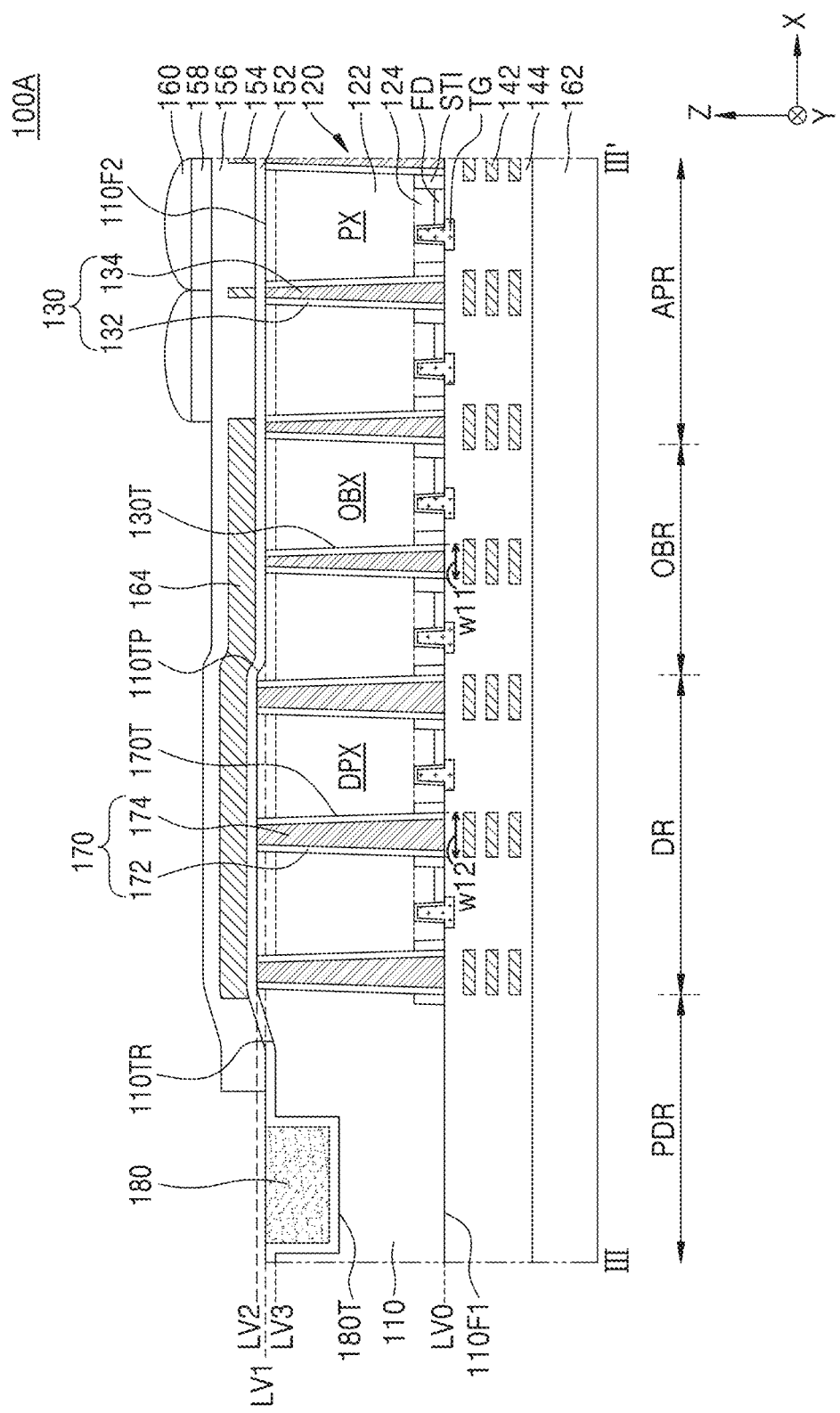

Referring to FIG. 19, a passivation layer 156 may be formed on the second surface 110F2 of the semiconductor substrate 110. The passivation layer 156 may cover the guide pattern 154 and the light blocking layer 164 and may not cover the top surface of the conductive pad 180.

Afterwards, a color filter 158 and a microlens 160 may be formed on the passivation layer 156 in the active pixel region APR.

The image sensor 100A may be completed by the above-described process.

According to the method of manufacturing an image sensor 100A according to the above-described example embodiments, the dummy element isolation film 170 may function as an etch stopping layer to prevent dishing of the semiconductor substrate 110 which may be caused by a difference in pattern density between the active pixel region APR and the pad region PDR in the step of planarizing the semiconductor substrate 110. Thus, the semiconductor substrate 110 may have a relatively flat top surface level in the pad region and the active pixel region, and the occurrence of defects in the subsequent patterning process may be prevented.

As described above, example embodiments have been disclosed in the drawings and specification. Although the example embodiments have been described herein with reference to specific terms, it should be understood that they have been used only for the purpose of describing the inventive concepts and not for limiting the scope of the inventive concepts as defined in the claims. Therefore, those skilled in the art will appreciate that various modifications and equivalent embodiments are possible without departing from the scope of the inventive concepts. Accordingly, the true scope of protection of the inventive concepts should be determined by the appended claims.

While the inventive concepts have been particularly shown and described with reference to embodiments thereof, it will be understood that various changes in form and details may be made therein without departing from the spirit and scope of the following claims.

What is claimed is:

1. An image sensor, comprising:
a semiconductor substrate having a first surface and a second surface;
a pixel element isolation film extending through an interior of the semiconductor substrate between the first and second surfaces of the semiconductor substrate and defining a plurality of active pixels in the semiconductor substrate; and
a dummy element isolation film extending through the interior of the semiconductor substrate between the first and second surfaces of the semiconductor substrate and extending along at least one side of the active pixels in a plan view and defining a plurality of dummy pixels in the semiconductor substrate,
wherein the pixel element isolation film has a first end that is substantially coplanar with the first surface, the first end of the pixel element isolation film having a first width in a first direction parallel to the first surface, and the dummy element isolation film has a first end that is substantially coplanar with the first surface, the first end of the dummy element isolation film having a second width that is greater than the first width of the pixel element isolation film.

2. The image sensor of claim 1, wherein
the pixel element isolation film is in a pixel trench extending through the interior of the semiconductor substrate from the first surface to the second surface,
the dummy element isolation film is in a dummy trench extending through the interior of the semiconductor substrate from the first surface to the second surface, and
the dummy element isolation film surrounds the pixel element isolation film in the plan view.

3. The image sensor of claim 2, wherein
the pixel element isolation film includes
an insulating liner on an inner sidewall of the pixel trench, and
a buried conductive layer filling an inside region of the pixel trench on the insulating liner,
the dummy element isolation film includes
a dummy insulating liner on an inner sidewall of the dummy trench, and
a dummy buried conductive layer filling an inside region of the dummy trench on the dummy insulating liner, and
the dummy buried conductive layer has a same material composition as the buried conductive layer.

4. The image sensor of claim 2, wherein
the pixel element isolation film includes
an insulating liner on an inner sidewall of the pixel trench, and
a buried insulating layer filling an inside region of the pixel trench on the insulating liner,
the dummy element isolation film includes
a dummy insulating liner on an inner sidewall of the dummy trench, and
a dummy buried insulating layer filling an inside region of the dummy trench on the dummy insulating liner, and
the dummy buried insulating layer has a same material composition as the buried insulating layer.

5. The image sensor of claim 1, further comprising:
an internal wiring structure on the first surface of the semiconductor substrate; and
an interlayer insulating film on the first surface of the semiconductor substrate and covering the internal wiring structure,
wherein the dummy element isolation film has a second end that is substantially coplanar with the second surface, the second end of the dummy element isolation film having a width that is less than the second width in the first direction.

6. The image sensor of claim 1, wherein
a top surface of the dummy element isolation film exposed on the second surface of the semiconductor substrate is distal from the first surface of the semiconductor substrate in relation to a top surface of the pixel element isolation film exposed on the second surface of the semiconductor substrate.

7. The image sensor of claim 1, wherein
the semiconductor substrate further includes a pad region configured to surround the dummy element isolation film in the plan view, and
the second surface of the semiconductor substrate in the pad region is proximate to the first surface of the semiconductor substrate in relation to a top surface of the pixel element isolation film.

8. The image sensor of claim 1, wherein
the pixel element isolation film has a first height in a third direction perpendicular to the first surface of the semiconductor substrate, and
the dummy element isolation film has a second height in the third direction, the second height being greater than the first height.

9. The image sensor of claim 1, wherein
the dummy element isolation film includes a plurality of dummy lines extending in a second direction parallel to the first surface and perpendicular to the first direction,
at least one dummy line of the plurality of dummy lines has the second width in the first direction at a same level as the first surface of the semiconductor substrate, and
at least another dummy line of the plurality of dummy lines has a third width in the first direction, at the same level as the first surface of the semiconductor substrate, that is greater than the second width.

10. The image sensor of claim 9, wherein
each given dummy line of plurality of dummy lines has a width that is proportional to a distance of the given dummy line from the active pixels.

11. The image sensor of claim 9, wherein
the dummy element isolation film includes
a plurality of narrow-width dummy lines extending in the second direction and having the second width in the first direction at the same level as the first surface of the semiconductor substrate, and
a plurality of wide-width dummy lines extending in the second direction and having the third width in the first direction at the same level as the first surface of the semiconductor substrate, the third width greater than the second width,
wherein the narrow-width dummy lines and the wide-width dummy lines are alternately arranged along the first direction.

12. An image sensor, comprising:
a semiconductor substrate including an active pixel region and a pad region, the semiconductor substrate having a first surface and a second surface opposite to the first surface;

a pixel element isolation film in the active pixel region of the semiconductor substrate, the pixel element isolation film in a pixel trench extending through an interior of the semiconductor substrate from the first surface to the second surface; and a dummy element isolation film in a dummy trench extending through the interior of the semiconductor substrate from the first surface to the second surface of the semiconductor substrate, the dummy element isolation film extending between the active pixel region and the pad region in at least one of a first direction and a second direction parallel to the first surface, wherein the pixel element isolation film has a first end that is substantially coplanar with the first surface, the first end of the pixel element isolation film having a first width in the first direction, and the dummy element isolation film having a first end that is substantially coplanar with the first surface, the first end of the dummy element isolation film having a second width in the first direction that is greater than the first width in the first direction.

13. The image sensor of claim 12, wherein
a top surface of the dummy element isolation film exposed on the second surface of the semiconductor substrate is distal from the first surface of the semiconductor substrate in relation to a top surface of the pixel element isolation film exposed on the second surface of the semiconductor substrate.

14. The image sensor of claim 12, wherein
the second surface of the semiconductor substrate in the pad region is proximate to the first surface of the semiconductor substrate in relation to a top surface of the pixel element isolation film.

15. The image sensor of claim 12, wherein
the pixel element isolation film has a first height in a third direction perpendicular to the first surface of the semiconductor substrate, and
the dummy element isolation film has a second height in the third direction, the second height greater than the first height.

16. An image sensor, comprising:
a semiconductor substrate including an active pixel region and a pad region, the semiconductor substrate having a first surface and a second surface opposite to the first surface;
a pixel element isolation film in the active pixel region of the semiconductor substrate, the pixel element isolation film in a pixel trench extending through an interior of the semiconductor substrate from the first surface to the second surface; and
a dummy element isolation film in a dummy trench extending through the interior of the semiconductor substrate from the first surface to the second surface, the dummy element isolation film in at least one side of the pixel element isolation film in a plan view, wherein the pixel element isolation film has a first height in a third direction perpendicular to the first surface of the semiconductor substrate, and the dummy element isolation film has a second height in the third direction, the second height greater than the first height.

17. The image sensor of claim 16, wherein
a top surface of the dummy element isolation film exposed on the second surface of the semiconductor substrate is distal from the first surface of the semiconductor substrate in relation to a top surface of the pixel element isolation film exposed on the second surface of the semiconductor substrate.

18. The image sensor of claim 16, wherein
the semiconductor substrate further includes an optical black region between the active pixel region and a dummy pixel region, and
the pixel element isolation film extends from the active pixel region to the optical black region.

19. The image sensor of claim 16, wherein
the dummy element isolation film includes
a plurality of first dummy lines extending in a first direction, and
a plurality of second dummy lines extending in a second direction and intersecting with the plurality of first dummy lines,
the pixel element isolation film includes
a plurality of first pixel isolation lines extending in the first direction, and
a plurality of second pixel isolation lines extending in the second direction and intersecting with the plurality of first pixel isolation lines,
a portion of each first dummy line of the plurality of first dummy lines intersects with each second pixel isolation line of the plurality of second pixel isolation lines, and
a portion of each of the plurality of second dummy lines intersects with each first pixel isolation line of the plurality of first pixel isolation lines.

20. The image sensor of claim 19, wherein
the pixel element isolation film includes
an insulating liner on an inner sidewall of the pixel trench, and
a buried conductive layer filling an inside region of the pixel trench on the insulating liner,
the dummy element isolation film includes
a dummy insulating liner placed on an inner sidewall of the dummy trench, and
a dummy buried conductive layer filling an inside region of the dummy trench on the dummy insulating liner,
the dummy buried conductive layer is connected to the buried conductive layer at an intersection point of the dummy element isolation film and the pixel element isolation film.

* * * * *